US012677630B2

(12) United States Patent
Prasad et al.

(10) Patent No.:  US 12,677,630 B2
(45) Date of Patent:       Jul. 7, 2026

(54) IDENTIFYING AND WEIGHING CARRIERS IN A SUBSTRATE PROCESSING SYSTEM

(71) Applicant: Applied Materials, Inc., Santa Clara, CA (US)

(72) Inventors: Bhaskar Prasad, Adityapur (IN); Thomas Brezoczky, Los Gatos, CA (US); Kirankumar Neelasandra Savandaiah, Bangalore (IN); Michael Richter, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 93 days.

(21) Appl. No.: 18/732,456

(22) Filed: Jun. 3, 2024

(65) Prior Publication Data

US 2025/0372426 A1      Dec. 4, 2025

(51) Int. Cl.
| | |
|---|---|
| *H01L 21/677* | (2006.01) |
| *B65G 54/02* | (2006.01) |
| *H01L 21/67* | (2006.01) |
| *H10P 72/00* | (2026.01) |
| *H10P 72/30* | (2026.01) |

(52) U.S. Cl.
CPC .......... *H10P 72/3204* (2026.01); *B65G 54/02* (2013.01); *H10P 72/0606* (2026.01); *H10P 72/3208* (2026.01); *B65G 2203/0283* (2013.01)

(58) Field of Classification Search
CPC ......... H01L 21/67709; H01L 21/67259; H01L 21/67715; B65G 54/02; B65G 2203/0283
USPC ................................................ 198/690.1, 805
See application file for complete search history.

(56) References Cited

U.S. PATENT DOCUMENTS

| | | | |
|---|---|---|---|
| 5,180,048 A | 1/1993 | Kawada et al. |
| 5,569,350 A | 10/1996 | Osada et al. |
| 5,641,054 A | 6/1997 | Mori et al. |
| 6,157,106 A | 12/2000 | Tietz et al. |
| 6,206,176 B1 | 3/2001 | Blonigan et al. |
| 6,231,716 B1 | 5/2001 | White et al. |

(Continued)

FOREIGN PATENT DOCUMENTS

| | | |
|---|---|---|
| CN | 101158852 A | 4/2008 |
| CN | 113707585 A | 11/2021 |

(Continued)

OTHER PUBLICATIONS

International Search Report and Written Opinion for PCT/US2025/031443 Dated Sep. 23, 2025.

(Continued)

*Primary Examiner* — James R Bidwell

(74) *Attorney, Agent, or Firm* — Patterson + Sheridan, LLP

(57)      ABSTRACT

A method and apparatus for identifying of a carrier of a group of carriers within a substrate processing system, wherein the carriers are conveyed by magnetic levitation through the substrate processing system. The carrier may be identified, for example, using an identification element of the carrier, at least two magnets on the carrier spaced apart by an identification distance, a weight of the carrier, a weight of a weighed feature of the carrier, or by the weight and location of a weighted feature of the carrier. Additionally, a method and apparatus for weighting the carrier in a station of the substrate processing system.

20 Claims, 9 Drawing Sheets

(56) References Cited

U.S. PATENT DOCUMENTS

| | | | |
|---|---|---|---|
| 6,572,321 B1 * | 6/2003 | Nulman | H01L 21/67772 |
| | | | 414/940 |
| 7,293,950 B2 | 11/2007 | Bonora et al. | |
| 7,438,175 B2 | 10/2008 | White et al. | |
| 7,841,820 B2 | 11/2010 | Bonora et al. | |
| 7,948,122 B2 | 5/2011 | Compter et al. | |
| 7,964,038 B2 | 6/2011 | Patalay et al. | |
| 7,994,486 B2 | 8/2011 | Smick et al. | |
| 8,104,951 B2 | 1/2012 | Aderhold et al. | |
| 8,851,817 B2 | 10/2014 | Bonora et al. | |
| 9,390,950 B2 | 7/2016 | Sorabji et al. | |
| 9,588,443 B2 | 3/2017 | Shibazaki | |
| 9,964,863 B1 | 5/2018 | Babayan et al. | |
| 10,204,810 B2 | 2/2019 | Hoey et al. | |
| 10,236,197 B2 | 3/2019 | Janakiraman et al. | |
| 10,256,124 B2 | 4/2019 | Mooring | |
| 10,262,887 B2 | 4/2019 | Hao et al. | |
| 10,283,397 B2 | 5/2019 | Willwerth et al. | |
| 10,460,977 B2 | 10/2019 | Breninger et al. | |
| 10,483,141 B2 | 11/2019 | Janakiraman et al. | |
| 10,490,436 B2 | 11/2019 | Ghosh et al. | |
| 10,734,265 B2 | 8/2020 | Janakiraman et al. | |
| 10,770,337 B2 | 9/2020 | Lee et al. | |
| 10,784,142 B2 | 9/2020 | Marcelynas et al. | |
| 10,851,453 B2 | 12/2020 | Tsai et al. | |
| 10,892,180 B2 | 1/2021 | Chia et al. | |
| 11,232,965 B2 | 1/2022 | Newman et al. | |
| 11,377,310 B2 | 7/2022 | Aust et al. | |
| 11,508,595 B2 | 11/2022 | Aust et al. | |
| 11,527,424 B2 | 12/2022 | Berger et al. | |
| 11,933,659 B2 * | 3/2024 | Kiendl | G01M 13/04 |
| 2002/0108842 A1 | 8/2002 | Bonora et al. | |
| 2003/0178145 A1 | 9/2003 | Anderson et al. | |
| 2003/0219977 A1 | 11/2003 | Pomarede et al. | |
| 2004/0023495 A1 | 2/2004 | Butterfield et al. | |
| 2004/0058293 A1 | 3/2004 | Nguyen et al. | |
| 2004/0152219 A1 | 8/2004 | Heuken | |
| 2004/0255442 A1 | 12/2004 | McDiarmid et al. | |
| 2006/0102078 A1 | 5/2006 | Fairbairn et al. | |
| 2006/0156981 A1 | 7/2006 | Fondurulia et al. | |
| 2007/0160507 A1 | 7/2007 | Satoh et al. | |
| 2007/0269297 A1 | 11/2007 | Meulen et al. | |
| 2008/0175694 A1 | 7/2008 | Park et al. | |
| 2008/0232947 A1 | 9/2008 | van der Meulen et al. | |
| 2008/0266037 A1 | 10/2008 | Williams | |
| 2009/0314211 A1 | 12/2009 | Du Bois et al. | |
| 2010/0062592 A1 | 3/2010 | Clark | |
| 2010/0136773 A1 | 6/2010 | Akae et al. | |
| 2010/0226737 A1 | 9/2010 | Sakaue et al. | |
| 2011/0312189 A1 | 12/2011 | Kim et al. | |
| 2012/0109355 A1 | 5/2012 | Baccini et al. | |
| 2012/0213614 A1 | 8/2012 | Bonora et al. | |
| 2012/0225206 A1 * | 9/2012 | Yudovsky | H01L 21/67784 |
| | | | 118/728 |
| 2012/0249291 A1 | 10/2012 | Holcomb et al. | |
| 2013/0171757 A1 | 7/2013 | Ponnekanti et al. | |
| 2014/0020629 A1 | 1/2014 | Tsai et al. | |
| 2018/0339816 A1 | 11/2018 | Oldendorf et al. | |
| 2018/0374732 A1 | 12/2018 | Klein et al. | |
| 2019/0283084 A1 * | 9/2019 | Foltz | B07C 5/18 |
| 2019/0348264 A1 | 11/2019 | Tsai et al. | |
| 2020/0026060 A1 | 1/2020 | Takato | |
| 2020/0056928 A1 | 2/2020 | Landrum et al. | |
| 2020/0232088 A1 | 7/2020 | White et al. | |
| 2020/0262060 A1 | 8/2020 | Hosek et al. | |
| 2020/0262660 A1 | 8/2020 | Hosek et al. | |
| 2020/0381276 A1 | 12/2020 | Yedla et al. | |
| 2021/0024929 A1 | 1/2021 | Yokota et al. | |
| 2021/0222292 A1 | 7/2021 | Wright, Jr. et al. | |
| 2021/0249291 A1 | 8/2021 | Raatz et al. | |
| 2021/0265188 A1 | 8/2021 | Moura et al. | |
| 2021/0296150 A1 | 9/2021 | Berger et al. | |
| 2021/0328146 A1 | 10/2021 | Heymanns et al. | |
| 2021/0354934 A1 | 11/2021 | Aust et al. | |
| 2021/0407831 A1 | 12/2021 | Sunugatov et al. | |
| 2022/0003718 A1 | 1/2022 | Watanabe | |
| 2022/0013383 A1 | 1/2022 | Savandaiah et al. | |
| 2022/0037181 A1 | 2/2022 | Hatano et al. | |
| 2022/0130700 A1 | 4/2022 | Newman et al. | |
| 2022/0208426 A1 | 6/2022 | Aust et al. | |
| 2022/0230904 A1 * | 7/2022 | Kubo | H01L 21/67742 |
| 2022/0293451 A1 | 9/2022 | Sulyman et al. | |
| 2022/0293452 A1 | 9/2022 | Sulyman et al. | |
| 2022/0336258 A1 | 10/2022 | Srivastava et al. | |
| 2022/0393618 A1 | 12/2022 | Aust et al. | |
| 2022/0415635 A1 | 12/2022 | Yedla et al. | |
| 2022/0415687 A1 * | 12/2022 | Hatano | H02K 41/031 |
| 2022/0415688 A1 | 12/2022 | Hatano et al. | |
| 2023/0085667 A1 | 3/2023 | Hudgens et al. | |
| 2023/0132174 A1 | 4/2023 | Thanu et al. | |
| 2024/0041058 A1 | 2/2024 | Foltz et al. | |
| 2024/0071796 A1 | 2/2024 | Berger et al. | |
| 2024/0120225 A1 * | 4/2024 | Shindo | H01L 21/67742 |

FOREIGN PATENT DOCUMENTS

| | | | |
|---|---|---|---|
| DE | 102018006259 A1 | 12/2019 | |
| EP | 1681261 A1 | 7/2006 | |
| EP | 4222779 A1 | 8/2023 | |
| JP | 62121134 A | 6/1987 | |
| JP | H06324297 A | 11/1994 | |
| JP | 2842559 B2 | 1/1999 | |
| JP | 2023-121377 A | 8/2023 | |
| KR | 10-20210081597 A | 7/2021 | |
| KR | 20220099611 A | 7/2022 | |
| KR | 102662444 B1 | 5/2024 | |
| TW | 202141675 A | 11/2021 | |
| WO | 2008077048 A2 | 6/2008 | |
| WO | 2011102410 A1 | 8/2011 | |
| WO | 2015007385 A1 | 1/2015 | |
| WO | 2015043712 A1 | 4/2015 | |
| WO | 2015140155 A1 | 9/2015 | |
| WO | 2015158725 A1 | 10/2015 | |
| WO | 2015162177 A1 | 10/2015 | |
| WO | 2015189263 A1 | 12/2015 | |
| WO | 2016162288 A1 | 10/2016 | |
| WO | 2019037858 A1 | 2/2019 | |
| WO | 2019052657 A1 | 3/2019 | |
| WO | 2019145035 A1 | 8/2019 | |
| WO | 2019238416 A1 | 12/2019 | |
| WO | 2020126040 A1 | 6/2020 | |
| WO | 2020192911 A1 | 10/2020 | |
| WO | 2021106796 A1 | 6/2021 | |
| WO | 2021106799 A1 | 6/2021 | |
| WO | 2021223843 A1 | 11/2021 | |
| WO | 2022044834 A1 | 3/2022 | |

OTHER PUBLICATIONS

International Search Report dated Oct. 17, 2025 for Application No. PCT/US2025/026606.

U.S. Appl. No. 18/081,493, filed Dec. 14, 2022.

U.S. Appl. No. 18/141,909, filed May 1, 2023.

U.S. Appl. No. 18/141,914, filed May 1, 2023.

U.S. Appl. No. 18/141,920, filed May 1, 2023.

U.S. Appl. No. 18/141,923, filed May 1, 2023.

U.S. Appl. No. 18/141,926, filed May 1, 2023.

U.S. Appl. No. 18/141,931, filed May 1, 2023.

International Search Report and Written Opinion in related application PCT/US2023/035709 dated Feb. 5, 2024.

International Search Report/ Written Opinion issued to PCT/US2023/079455 on Mar. 6, 2024.

Yu et al.; Controller design and implementation of six-degree-of-freedom magnetically levitated positioning system with high precision; Proc. IMechE vol. 222 Part I: J. Systems and Control Engineering; 12 pages.

Zhu et al; Design and Control of a Six Degrees-of-Freedom Magnetically Levitated Positioning System; IFAC PapersOnLine 49-21 (2016) pp. 127-132.

Temposonics; Sensor Selector Guide; Retrieved from the Internet at: <https://www.temposonics.com/docs/temposonicslibraries/literature/

(56)     References Cited

OTHER PUBLICATIONS sensor_selector_guide_industrial_551814_en.pdf?sfvrsn=5fde8874_
12>; 21 pages.
Linear Motion Tips; How do Magnettostrictive sensors work ?;
Retrieved from the Internet at: <https://www.linearmotiontips.com/
how-do-magnetostrictive-sensors-work/> 9 Pages.
U.S. Appl. No. 18/607,043, filed Mar. 15, 2024.
U.S. Appl. No. 18/517,404, filed Nov. 22, 2023.
U.S. Appl. No. 18/377,572, filed Oct. 6, 2023.
U.S. Appl. No. 18/433,993, filed Feb. 6, 2024.
U.S. Appl. No. 18/081,493, filed Nov. 2, 2023.
U.S. Appl. No. 18/417,510, filed Jan. 19, 2024.
U.S. Appl. No. 18/417,510, filed Oct. 2, 2023.
U.S. Appl. No. 29/904,232, filed Oct. 24, 2023.
U.S. Appl. No. 18/241,840, filed Sep. 1, 2023.
Office Action issued to U.S. Appl. No. 18/732,468 on Mar. 26, 2026
in 25 pages.

* cited by examiner

900

901
CONVEY A CARRIER IN A
FIRST PROCESS STATION

903
LOWER THE CARRIER ON A
LANDING RAIL ASSEMBLY

905
MEASURE A WEIGHT OF THE
CARRIER

1000

1001
OBTAIN A POSITION OF A FIRST
MAGNET OF A CARRIER

1003
OBTAIN A POSITION OF A
SECOND MAGNET OF A CARRIER

1005
DETERMINE A DISTANCE
BETWEEN THE FIRST MAGNET
AND THE SECOND MAGNET

1007
DETERMINE AN IDENTITY OF THE
CARRIER BASED ON THE
DISTANCE

IDENTIFYING AND WEIGHING CARRIERS IN A SUBSTRATE PROCESSING SYSTEM

BACKGROUND

Field

Embodiments of the present disclosure generally relate to a semiconductor process equipment used to convey semiconductor substrates.

Description of the Related Art

Semiconductor devices are typically formed on semiconductor substrates using numerous process chambers, where each process chamber is used to complete one or more of the various steps (e.g., depositions) to form the semiconductor devices, such as a memory chip. Substrate transfer systems are typically used to move the substrates between each of the process chambers. The process chambers as well as the substrate transfer system can each be held at vacuum. Two common arrangements used for substrate transfer systems include a cluster arrangement and a linear arrangement.

A substrate transfer system using a cluster arrangement includes a central region surrounded by the different process chambers. The central region can be connected to a load lock chamber in order to maintain the vacuum environment within the substrate transfer system when the substrates are supplied and removed from the substrate transfer system. The central region, or transfer chamber, also typically includes a fixed robot that rotates about a central axis to move substrates to and from the load lock chamber as well as between the process chambers. These conventional robots are often limited to only transferring one or two substrates at a time and can cause the footprint of the central region to be large, due to the need for the robot to rotate and extend into the process chambers without the robot's arms interfering with the walls of the central region chamber in which the robot resides. These types of conventional robots can also be a source of particles, which is undesirable.

A substrate transfer system using a linear arrangement typically includes a conveyor having a rectangular top surface with process chambers on one side or opposing sides of the conveyor. The conveyor can be connected to a load lock chamber in order to maintain the vacuum environment within the substrate transfer system when the substrates are supplied and removed from the substrate transfer system. One or more robots that can be positioned near each of the process chambers to transfer the substrates between the conveyor and the process chambers. The conveyors used in these linear substrate transfer systems can be a source of particle generation, and require regular and involved maintenance activities to assure that the conveyor is performing correctly. Furthermore, the conveyor can only be moved in one direction at a time, which can limit the movement of the substrates on the conveyor reducing throughput.

Therefore, there is a need for improved substrate transfer systems that have reduced particle generation and footprint as well as have an increased throughput.

SUMMARY

In one embodiment, a method of measuring a weight of a carrier comprises: supplying a current to a plurality of stators of a substrate station to levitate a carrier of a plurality of carriers in a vertical position within a transport region within the substrate station, wherein each carrier of the plurality of carriers has a unique weight; measuring the current supplied to at least one stator of the plurality of stators to levitate the carrier at the vertical position; determining a force generated by the at least one stator to levitate the carrier at the vertical position based on the measured current; and determining a weight of the carrier levitated at the vertical position based on the force.

In one embodiment, a method of identifying a carrier comprises: supplying a current to a plurality of stators of a substrate station to levitate a carrier of a plurality of carriers in a vertical position within a transport region within the substrate station, wherein each carrier of the plurality of carriers has a weighted feature placed at a location of the carrier; measuring the current to each stator of the plurality of stators above the carrier; determining a force generated by each stator based on the measured current supplied to each stator; determining the location and a weight of the weighted feature based on differences in current to each stator; and identifying which carrier of the plurality of carriers is within the substrate station based on the weight and location of the weighed feature.

In one embodiment, a substrate processing station comprises a housing; a membrane disposed in the housing, the membrane isolating a first region within the housing from a second region within the housing; a magnetic levitation actuator assembly disposed in the first region, wherein the magnetic levitation actuator assembly is configured to generate a first magnetic field that extends through the membrane and within a transport region to convey a carrier within the transport region; and a landing rail system at least partially disposed in the transport region, the landing rail system including at least one weight sensor configured to measure a weight of the carrier when the carrier is engaged with the landing rail system.

In one embodiment, a carrier comprises: a base including a top side, a first side, a second side, and a bottom side; a first array of features coupled to the top side of the base; at least one support member coupled to the base, the at least one support member configured to support a substrate; and a first magnet and a second magnet coupled to the base, wherein the first magnet and the second magnet are spaced apart by an identification distance, wherein the identification distance is indexed to an identity of the carrier.

In one embodiment, a method of identifying a substrate carrier within a processing line of a substrate processing system comprises obtaining a position of a first magnet of a carrier with a first position sensor of a first station of the processing line, wherein the carrier is one of a plurality of carriers disposed in the processing line; obtaining a position of a second magnet of the carrier with the first position sensor; determining a distance between the first magnet and the second magnet of the carrier based on the obtained position of the first magnet and the obtained position of the second magnet; and determining an identity of the carrier within the first station based on the distance between the first magnet and second magnet.

In one embodiment, a method of identifying a substrate carrier comprises: obtaining a position of a first magnet of a carrier with a first position sensor, wherein the carrier is one of a plurality of carriers disposed in a processing line of a processing system; obtaining a position of a second magnet of the carrier with a second position sensor; determining a distance between the first magnet and the second magnet of the carrier based on the obtained position of the first magnet and the obtained position of the second magnet; and determining an identity of the carrier based on the distance between the first magnet and second magnet.

In one embodiment, a substrate processing station comprises: a housing; a membrane disposed in the housing, the membrane isolating a first region within the housing from a second region within the housing; a magnetic levitation actuator assembly disposed in the first region, wherein the magnetic levitation actuator assembly is configured to generate a first magnetic field that extends through the membrane into the second region to levitate a carrier within the second region; and an identification sensor disposed in the housing, the identification sensor configured to detect an identification element of the carrier, and wherein the carrier includes a top side, a bottom side, a first side, and a second side.

In one embodiment, a carrier comprises: a base including a top side, a bottom side, a first wing, and a second wing; a first array of features disposed on an upper surface of the first wing; a second array of features disposed on an upper surface of the second wing; at least one support member coupled to the base, the at least one support member configured to support a substrate; and at least one weighted feature coupled to the base to identify the carrier from a group of carriers.

In one embodiment, a substrate processing system comprises a factory interface; and a processing line, the processing line including a plurality of stations with a plurality of discrete carrier positions, wherein a number of carriers are magnetically levitated and conveyed through the processing line, wherein the number of carriers is equivalent to the number of discrete carrier positions in the processing line minus at least one.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the present disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figures 1, 2A, 2B:
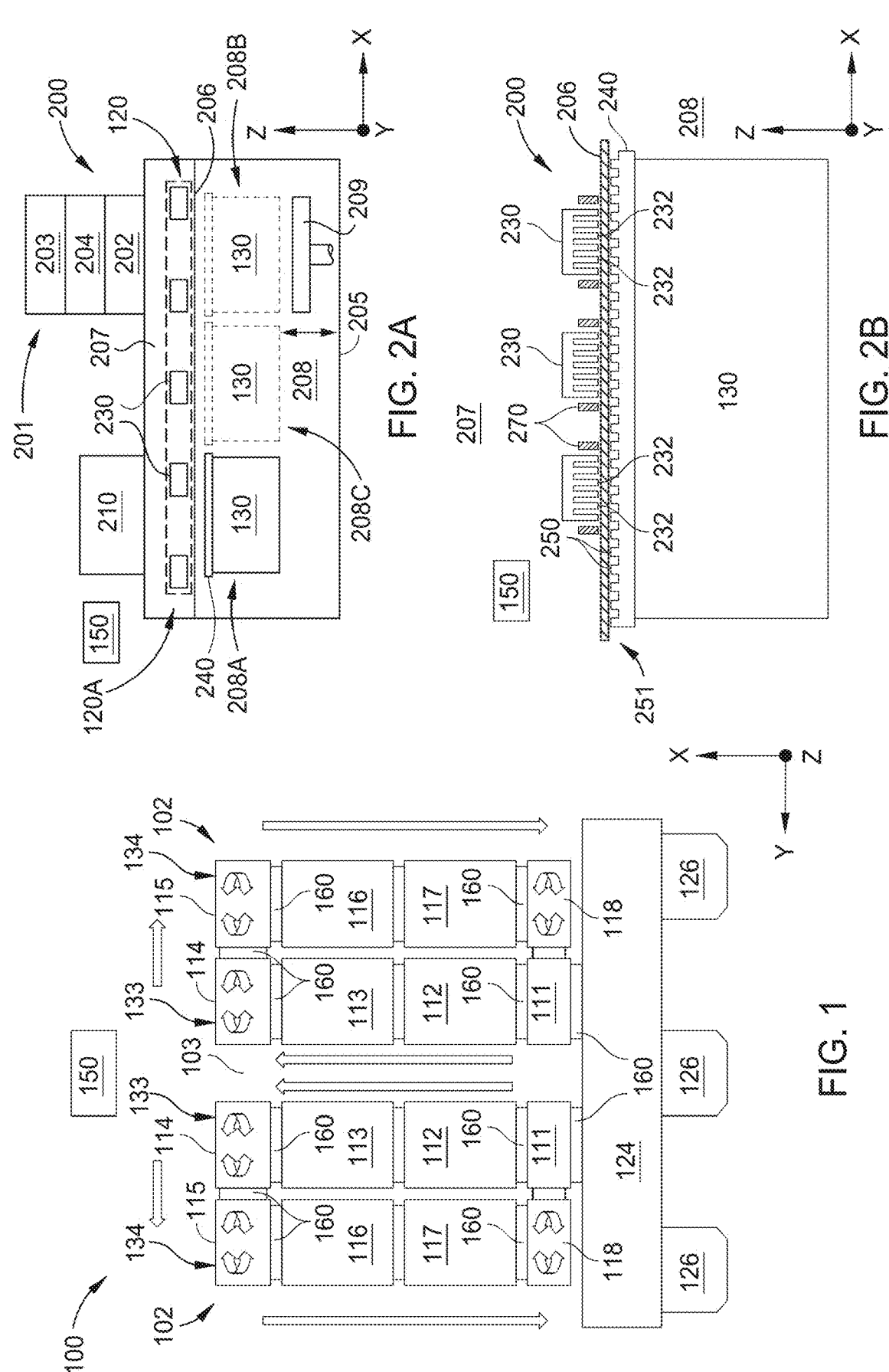
FIG. 1 illustrates a top schematic view of an example substrate processing system, in which embodiments of the present disclosure may be implemented.
FIG. 2A illustrates a side view of a portion of an example station of the substrate processing system of FIG. 1, in which embodiments of the present disclosure may be implemented.
FIG. 2B illustrates a side view of a portion of an example station of the substrate processing system of FIG. 1, in which embodiments of the present disclosure may be implemented.

The present disclosure relates generally to semiconductor process equipment used to transfer semiconductor substrates between process stations. More specifically, embodiments disclosed herein are related to systems used to transfer semiconductor substrates disposed on carriers between process stations using a transport device that employs one or more magnetic levitation actuator assemblies to move the carriers between the process stations. The magnetic levitation actuator assemblies are separated from the carrier by a magnetically permeable membrane.

Using magnetic levitation to transport substrates between process chambers offers a number of advantages. First, magnetic levitation enables designs to achieve a reduced footprint, because robots, which are typically used to transfer the substrates into and out of the process chambers, are not necessarily positioned within and thus can be removed from the vacuum or gas composition controlled substrate transfer environments. Reducing the footprint of a substrate processing system can reduce the capital costs of a substrate processing system, as well as the operating and maintenance costs of the system, and reduce the costs associated with the foot-print that the substrate processing system takes up in a semiconductor fab.

Using magnetic levitation to transport substrates generates fewer particles and less contamination as compared to mechanical systems that have moving parts, dynamic seals, and vacuum compatible greases, which can generate particles and outgas in a vacuum environment. For example, the movement of a central conveyor to transport substrates between process chambers can generate particles from the motion of the conveyor relative to its supporting components and from the contact between a substrate and the conveyor. The generated particles and contamination can negatively affect product quality and in some cases reduce production yield.

Using magnetic levitation to transport the substrate between stations increases the throughput of a substrate processing system. In conventional substrate processing systems, the substrate is transferred to and from processing chambers by one or more robotic arms. For example, a substrate may be picked up by a first robotic arm from a load lock, transferred from the first robotic arm to a second robotic arm, and then placed in a chamber, such as a process chamber, by the second robotic arm. Each transfer of the substrate takes time that could be used to process the substrate. As a result, each transfer increases the amount of time necessary to process the substrate. Conveying the substrate between stations of a substrate processing system by magnetic levitation eliminates the need for multiple robotic arms. Additionally, the amount of time to convey the substrate between stations by magnetic levitation is significantly less than the amount of time to transfer the substrate by robotic arms. It is believed that magnetic levitation can be used to increase throughput of a substrate processing system by up to or more than 50%.

The carriers that the substrates are disposed on are circulated through a plurality of stations. Knowing the position of the carrier within the station and the identity of the carrier within the station facilitates fabrication of the substrates. In some embodiments, the position of magnets on the carriers can be a unique signature identifying the carrier. The carriers can also be identified by having a unique weight. In some embodiments, a carrier can be identified based on the weight and location of a weighted feature (e.g., mass element) that is coupled to the carrier. The carrier can also be identified by an identification sensor disposed in the station that detects an identification element of the carrier (e.g., a physical feature or barcode, RF tags). Additionally, the weight of the carrier can also be used to evaluate if the carrier needs to be replaced due to deposition build up.

FIG. 1 illustrates a top schematic view of an example substrate processing system 100, in which embodiments of the present disclosure may be implemented. The substrate processing system 100 includes a controller 150 and one or more processing lines 102.

The one or more processing lines 102 each include a plurality of stations, as illustrated in FIG. 1. In one example, the processing line 102 illustrated on the right side of FIG. 1 includes at least four process stations 112, 113, 116, and 117, the processing line 102 illustrated on the left side of FIG. 1 includes at least four process stations 112, 113, 116, and 117. However, process stations 111, 114, and 115 may also be configured to perform one or more substrate processing processes. Each processing line 102 may include a magnetic transportation system (not shown) that include a plurality of individual magnetic levitation assemblies disposed within the stations 111-118 that are configured to convey an object 140 (FIG. 3) disposed on a carrier 130 (FIGS. 2A-2C, and exemplary carrier 300 shown in FIG. 3) through the processing line 102. Each processing line 102 may be independent of other processing lines 102. The processing lines 102 may be physically separated by one another by a gap 103. The gap 103 may be sized such that a technician may walk between each processing line 102 to service the one or more stations 111-118.

Each processing line 102 may include a plurality of slit valves 160 to selectively isolate each station 111-118. The slit valves 160 may be selectively opened and closed to allow a clear path for the travel of the carrier 130, to selectively isolate the stations 111-118 from one another, and to facilitate the pressurization or depressurization of the stations 111-118.

The substrate processing system 100 may be used to process multiple substrates in each processing line 102 to produce a desired fabricated substrate. In some cases, the substrate processing system 100 may include a plurality of physical vapor deposition (PVD) processing chambers. For example, the first station 111 may be a first load lock station, the second station 112 may be a degas station, the third station 113 may be a pre-clean station, the fourth station 114 may be a routing station, the fifth station 115 may be a routing station, the sixth station 116 may be a PVD tantalum nitride deposition station, the seventh station 117 may be a PVD copper deposition station, and the eighth station 118 may be a routing station that also serves as a buffer station. An object 140 (e.g., substrate) may be transferred and processed within each process station 112-113 and 116-117. The pressure within each station 111-118 may decrease from station to station. For example, the pressure within the seventh station 117 may be lower than the pressure within the other stations (e.g., stations 111-116 and 118).

The first station 111 (e.g., load lock station) may have a magnetic levitation assembly 120 (shown in FIG. 2A), which includes one or more magnetic levitation actuator assemblies 120A that include a plurality of linear stators 230 (FIG. 2B) and a plurality of sensors 270. Each magnetic levitation actuator assembly 120A may include the plurality of linear stators 230 arranged in a linear array (e.g., row) and the plurality of sensors 270 arranged in a linear array adjacent to the array of linear stators 230. The carrier 130 is conveyed along the array of linear stators 230. As will be discussed further below, the stations 111-118 will each typically include two or more magnetic levitation actuator assemblies 120A that are spaced apart within each of the stations 111-118 to support the carrier 130 as the carrier 130 is transferred through the station. The stations 112-113 and 116-117 (e.g., process stations) may each have a magnetic levitation assembly 120. The fourth station 114, fifth station 115, and eighth station 118 (e.g., routing stations) may each have a magnetic levitation assembly 120. The fifth station 115 may also include a plurality of shutter disks to be placed on a carrier 130 without the object 140. The shutter disks are used to receive deposition material when needed in the place of the object 140 to clean processing equipment, such as cleaning buildup found on a PVD target disposed within the PVD deposition process stations (e.g., stations 116-117).

The magnetic levitation assembly 120 of the first station 111 and the magnetic levitation assembly 120 of the eighth station 118 may cooperate to change the transfer direction (e.g., X-direction to Y-direction) of the carrier 130 within the substrate processing system 100. Additionally, the magnetic levitation assembly 120 of the fourth station 114 and the magnetic levitation assembly 120 of the fifth station 115 may cooperate to change the transfer direction of travel of the carrier 130.

FIGS. 1, 2A, 2B, 2C, and 3-7 include an X-Y-Z coordinate system to illustrate the transfer directions of the carrier 130 and object 140 through the substrate processing system 100, as well as the orientation of the carrier (e.g., carrier 130, 300). The arrows illustrate the direction that one or more carriers 130 circulate within the processing line 102. During an example processing operation, the carrier 130 receives an object 140 (see FIG. 3) entering the first station 111 in the X-direction from one or more front opening unified pods (FOUPS) 126 of a factory interface 124. The carrier 130 is then conveyed to the second station 112 in the X-direction. The first station 111 also receives the carrier 130 from the eighth station 118 in the Y-direction. After the carrier 130 is conveyed into the second station 112, the carrier 130 is conveyed to the fourth station 114 through the third station 113 in the X-direction. The carrier 130 is then conveyed from the fourth station 114 to the fifth station 115 in the Y-direction. The carrier 130 is then conveyed from the fifth station 115 to the eighth station 118 in the negative X-direction through the stations 116-117. The carrier 130 is then conveyed in the Y-direction back into the first station 111. The now fabricated object 140 is transferred back to the FOUP 126. Another object 140 may then be placed onto the carrier 130 in the first station 111 for another processing operation. A shutter disk may be conveyed on a carrier 130 from the fifth station 115 to the first station 111 in a similar manner as the object 140.

In some embodiments of the substrate processing system 100, the processing line 102 has a non-deposition portion 133 and a deposition portion 134. The non-deposition portion 133 may include a linear arrangement of stations, such as the first station 111, the second station 112, the third station 113, and the fourth station 114, that do not subject the object 140 to a process that deposits a layer on the object 140. After the object 140 passes through the non-deposition portion 133, the object 140 is conveyed into the deposition portion 134 that may be a linear arrangement of stations, such as the fifth station 115, the sixth station 116, the seventh station 117, and the eight station 118, that includes at least one station that deposits at least one layer on the object. For example, the non-deposition portion 133 includes the first station 111 that is a first load lock, the second station 112 that is a degas station, the third station 113 that is a pre-clean station, and the fourth station 114 that is a routing station. The deposition portion 134 includes the fifth station 115 that is a routing station, the sixth station 116 that is a tantalum nitride deposition station, the seventh station 117 that is a copper deposition station, and the eighth station 118 that is a routing station that also serves as a buffer station.

Figure 3:
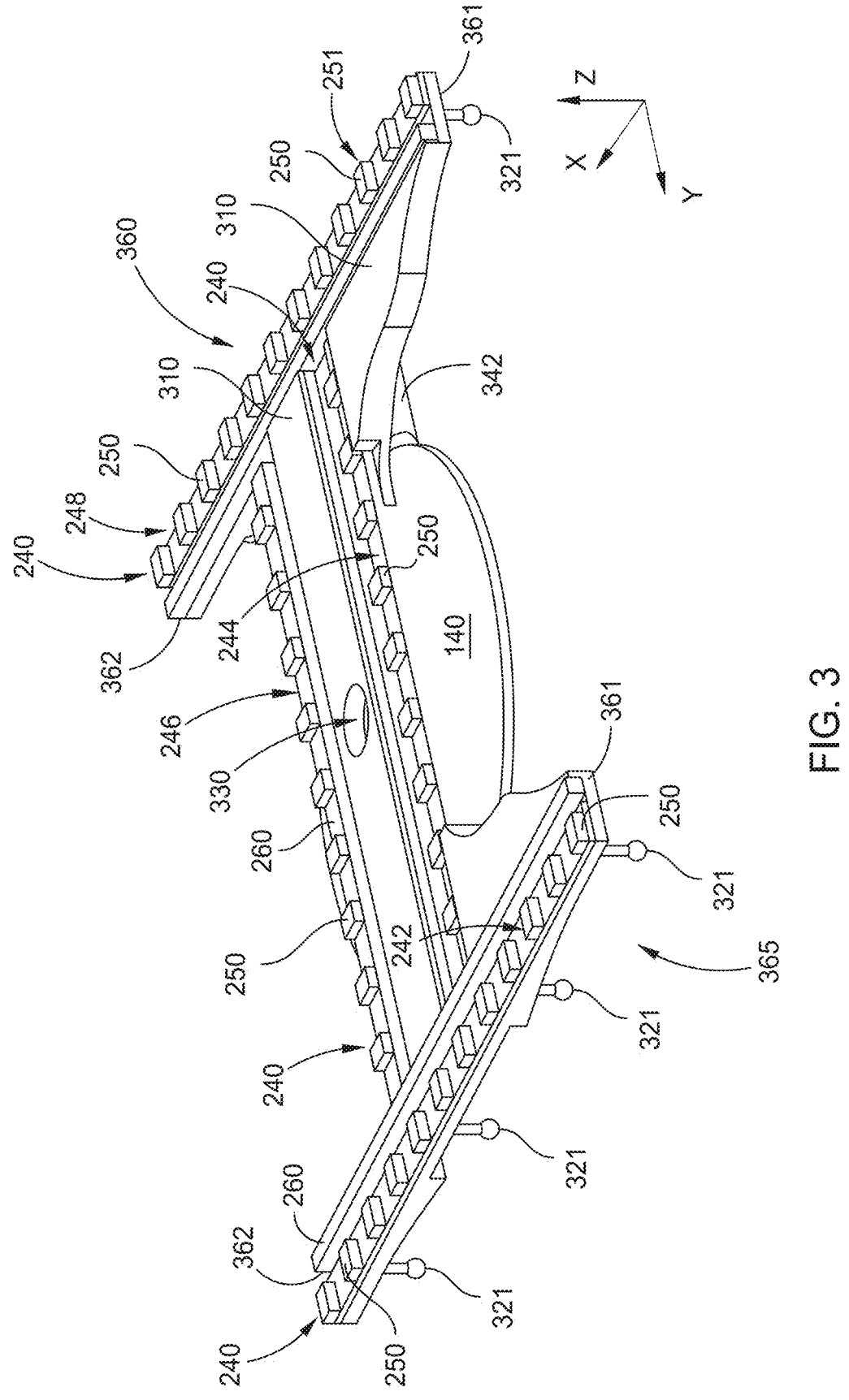
FIG. 3 is a top front isometric view of an example carrier that includes a base and a magnetic levitation element, in accordance with embodiments of the present disclosure.

A group of carriers, such as carriers 130 shown in FIG. 2A or carrier 300 shown in FIG. 3, are circulated through each processing line 102 of the processing system 100. Additionally, the identity of each carrier in the group may be identifiable within station of the processing line 102. For example, each station within the processing line 102 may be configured to identify which carrier of the group of carriers is disposed thereon. Determining the identity and location of the carrier within the processing line 102 allows for the carrier to be tracked over time and also allows for the processes performed on the substrate 140 carried by the carrier to be tracked over time.

The number of carriers within the group may be selected to enhance throughput through the processing line 102. Each station (e.g. processing stations, load lock, routing stations, etc.) within the processing line 102 includes one or more discrete carrier positions that the carrier can be moved to within the station. These discrete carrier positons may be the first park position 208A, second park position 208C, and the transfer position 208B shown in FIG. 2A. The number of carriers in the group of carriers is equivalent to the number of discrete park positions in the processing line minus at least one. In other words, there will be at least one discrete position within the processing line 102 that does not have a carrier present at any point in time to facilitate the circulation of the group of carriers through the processing line 102. In some embodiments, the number of carriers is equivalent to the number of discrete carrier positions minus two to maximize throughput through the processing line 102. In some embodiments, the number of carriers is equivalent to the number of discrete carrier positions minus one. In some embodiments, the number of carriers is equivalent to the number of discrete carrier positions minus three or more.

As one example, and referring to FIG. 1, the processing line 102 may include four processing stations (e.g., second station 112, third station 113, sixth station 116, and seventh station 117) each having at least two discrete carrier positions. The processing line 102 may also include a load lock (e.g., first station 111) having one discrete carrier positions (e.g., position to facilitate transfer of substrate 140 to and from the factory interface 124). The processing line 102 may also include three routing stations (e.g., fourth station 114, fifth station 115, and eighth station 118) each having one discrete carrier position (e.g., position where the carrier is placed prior to moving to the next station). For example, the processing line 102 shown in FIG. 1 may have at least 12 discrete carrier locations with up to 11 carriers disposed therein.

FIG. 2A and FIG. 2B illustrate side views of a portion 200 of an example process station (e.g., stations 112-113 and 116-117) of the substrate processing system 100 of FIG. 1, in which embodiments of the present disclosure may be implemented. The example process station, which may be the process station 112-113, 116-117 described above, may be referred to herein as simply the process station 205 for clarity. The process station 205 may be configured for contactless transportation of the carrier 130. The process station 205 may include a process chamber 201 that is maintained at a vacuum pressure, such that a processing region 204 of the process chamber 201 is at a pressure that is less than 760 Torr, or even at a pressure between 1 milliTorr (mTorr) and 500 Torr. The process station 205 may be configured for contactless transportation of the carrier 130 in a vacuum chamber (see second region 208) disposed below the processing chamber.

The process station 205 may include a membrane 206 (FIGS. 2B-2C) disposed between the carrier 130 and the magnetic levitation assembly 120. The pressure may be different on opposing sides of the membrane 206. For example, the membrane 206 may be a barrier that isolates a first region 207 of the process station 205 that includes the magnetic levitation assembly 120 from a second region 208 (e.g., vacuum chamber, transport region) where the carrier 130 is located. The first region 207 may be at atmospheric pressure while the second region 208 may be at a vacuum pressure.

The membrane 206 may be made from a material selected from a group comprising transition metals (e.g., iron, nickel, cobalt) and their alloys, and alloys of rare-earth metals. In some embodiments, the membrane 206 is formed from a non-ferromagnetic material, such as some found in metallic and ceramic materials. In one example, the membrane 206 may be formed from a stainless steel, such as a non-ferromagnetic stainless steel (e.g., 301, T304, 304, 316). In some embodiments, the membrane is formed from a titanium alloy. In another example, the membrane is formed from a ceramic material, such e.g., alumina, quartz, zirconia, etc. Thus, the membrane 206 may be made of a non-transparent material in some embodiments that blocks the line of sight between the sensor 270 and the carrier 130.

The carrier 130 may be configured to carry one or more objects 140. For example, the carrier 130 may be a substrate carrier, a shutter disk carrier or a mask carrier. The carrier 130 may also be configured to transport process kit component parts. The carrier 130 may be transported in the X-direction or negative X-direction, as illustrated in FIG. 2A. The carrier 130 may also be transported in the Y-direction or negative Y-direction, as described above.

The carrier 130 includes one or more a magnetic levitation elements 240 that allow the carrier 130 to be levitated and transported through the process station 205. The magnetic levitation element 240 may be a track in the X-direction or the Y-direction. The magnetic levitation element 240 may be a substantially straight magnetic levitation element 240, or may at least include one or more straight portions that allow the carrier 130 to be contactlessly transported through the substrate processing system 100. The magnetic levitation element 240 may define a transportation direction (or transport direction), along which the carrier 130 is contactlessly transported. In one example, as illustrated in FIG. 2A, the carrier 130, which includes one or more magnetic levitation elements 240, is transferred through the process station 205, and to and from other adjacent process stations 205 (not shown), by magnetic levitation, without the carrier 130 contacting the walls or components within the process station 205.

As illustrated in FIG. 2A, the process station 205 includes a magnetic levitation assembly 120 that includes a plurality of magnetic levitation actuator assemblies 120A. The magnetic levitation actuator assemblies 120A interact with a corresponding magnetic levitation element 240 through the membrane 206. The magnetic levitation actuator assemblies 120A each include a plurality of linear stators 230. For example, a magnetic levitation actuator assembly 120A may include two or more, three or more, five or more, or 10 or more linear stators 230, depending on the desired length of the magnetic levitation elements 240, which is often referred to herein as a magnetic levitation element 240. Alternatively, the magnetic levitation actuator assemblies 120A of the magnetic levitation assembly 120 may include one elongated linear stator 230 extending along the entire length of a magnetic levitation element 240. The number of linear stators 230 shown in FIGS. 2A and 2B are examples, and a greater or lesser number of linear stators 230 may be used.

The linear stator 230 may be arranged to guide a corresponding magnetic levitation element 240 of the carrier 130 underneath. For example, a plurality of linear stators 230 may be disposed one after the other in a row, such as shown in FIG. 2A, extending in the X and/or Y-direction. In some embodiments, the one or more linear stators 230 are configured to remain stationary during contactless transportation of the carrier 130 along the magnetic levitation element 240 since the one or more linear stators 230 are coupled to a wall (e.g., top wall or side wall) of the process station 205.

The one or more linear stators 230 may include a plurality of stator poles 232, such as 2, 4, 6, 8 or more stator poles 232, as illustrated in FIG. 2B. The number of stator poles 232 shown in FIGS. 2A and 2B are examples, and a greater or lesser number of stator poles 232 may be used. The stator poles 232 may be protrusions, or teeth, that may project towards the carrier 130 and/or towards a magnetic levitation element 240 attached to the carrier 130. The plurality of stator poles 232 may define at least one comb structure. In some embodiments, a linear stator 230 may include two comb structures, each having a plurality of stator poles 232.

The magnetic levitation assembly 120, which includes the one or more linear stators 230, and the stator poles 232, may include, or be made of, a magnetic material, more specifically a ferromagnetic material. The magnetic material may be a non-permanent, or soft, magnetic material. The magnetic material may be a metal, such as electrical steel, silicon steel, ferritic steel, martensitic steel, or any other soft magnetic material.

The magnetic levitation element(s) 240 of the carrier 130 may include, or be made of, a magnetic material, such as a ferromagnetic material. The magnetic material may be a non-permanent, or soft, magnetic material. The magnetic material may be a metal, such as electrical steel, silicon steel, ferritic steel, martensitic steel, or any other soft magnetic material.

In some embodiments, as shown in FIG. 2A, the carrier 130 may be levitated and contactlessly transported in the X or Y-direction through the substrate processing system 100, for example when the carrier 130 is a substrate carrier for a large area substrate or a mask carrier carrying a mask for a large area substrate. The magnetic levitation element 240 is coupled to a portion of the top of the carrier 130, as illustrated. The magnetic levitation assembly 120, or at least a portion thereof, may be disposed above the carrier 130.

The carrier 130 is configured to be levitated and transported along the length of the magnetic levitation assembly 120 by use of the one or more linear stators 230 of the magnetic levitation assembly 120 that remain stationary within the process station 205. During contactless levitation and/or transportation of the carrier 130, the magnetic levitation element 240 faces at least one linear stator 230. The magnetic levitation element 240 may respectively face different linear stators 230 as the carrier 130 is transported along the magnetic levitation element 240.

Figure 2C:
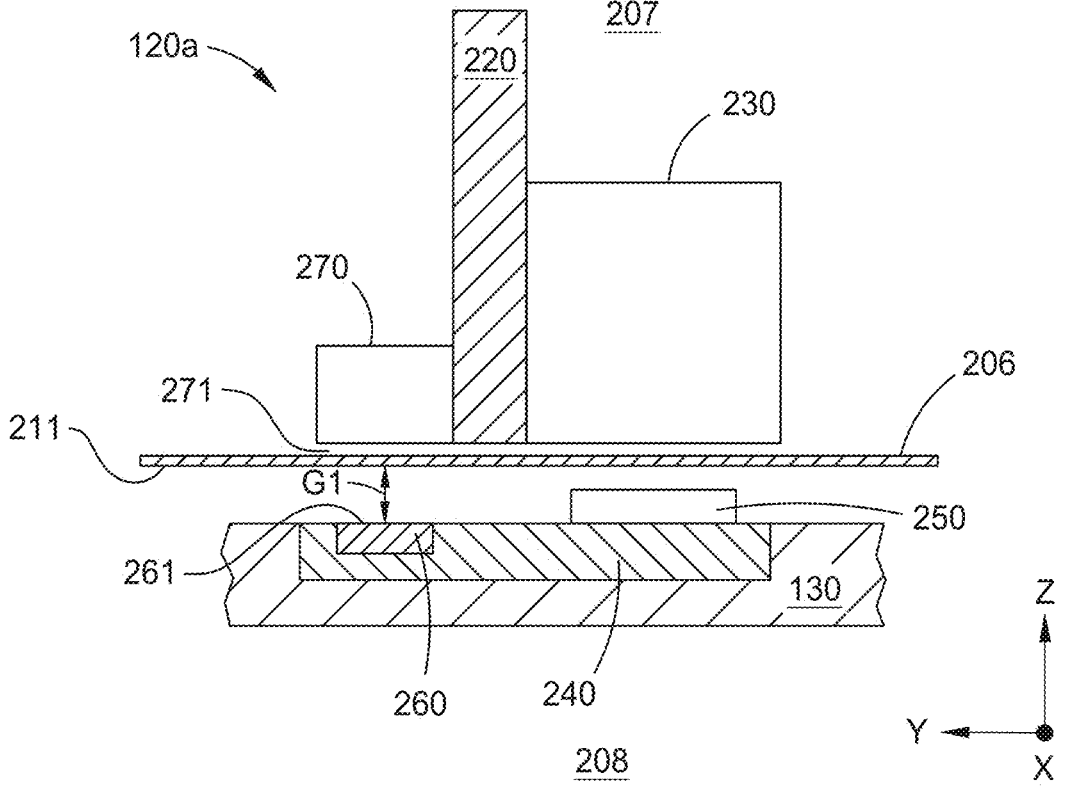
FIG. 2C illustrates a schematic partial cross-sectional view of the portion shown in FIG. 2B, in which embodiments of the present disclosure may be implemented.

As shown in FIGS. 2B-2C and FIG. 3, the magnetic levitation element 240 may include an array of features 250 or any feature intended to confine magnetic fields lines from the actuator poles. Any number of features 250 may be formed within an array of features 251. The features 250 may be protrusions, or teeth, that may project towards at least one linear stator 230 of the opposing magnetic levitation actuator assembly 120A. The raised segments of features 250, which include a magnetic material, may define a comb-like structure as illustrated in FIGS. 2B and FIG. 3. Each magnetic levitation element 240 may also include a featureless element 260 adjacent to each array of features 250. The featureless element 260 may span the same or part of the length of the array of features 251. An upper surface 261 of the featureless element 260 may be planar (e.g., a flat surface), which the sensors 270 uses to measure and/or or detect a position of the carrier 130 during contactless levitation and/or transportation. In some embodiments, the featureless element 260 is formed from a ferrous material, such as being a strip of a ferromagnetic material embedded in or attached to the carrier 130. For example, the featureless element 260 may be made of magnetic stainless steel.

A pitch, or spacing, may be provided between adjacent stator poles 232 of a linear stator 230. The term "adjacent stator poles" (and likewise "adjacent features 250") refers to poles of a same linear stator 230 that are adjacent to each other with respect to the direction defined by the magnetic levitation element 240, such as the transportation direction (e.g., X-direction in FIG. 2A). The pitch may be a distance, e.g. a horizontal distance, extending along the magnetic levitation element 240. Likewise, a pitch or spacing may be provided between adjacent features 250 of the magnetic levitation element 240. According to some embodiments, a first pitch between adjacent stator poles 232 of a linear stator 230 may be different from a second pitch between adjacent features 250 of the magnetic levitation element 240. Particularly, a ratio of the first pitch and the second pitch may be non-integer (the first pitch is not an integer multiple of the second pitch and the second pitch is not an integer multiple of the first pitch). The stator poles 232 of the linear stator 230 and the features 250 of the magnetic levitation element 240 may be provided according to a p/q configuration. A p/q configuration means that the distance (in the transportation direction) spanned by p consecutive adjacent stator poles 232 of the linear stator 230 includes a total of q features 250 of the magnetic levitation element 240. In some embodiments, q may be equal to p+1 or to p−1. For example, it may be the case that p=3 and q=2; or p=3 and q=4. In further examples, it may be the case that p=4 and q=3.

According to some embodiments, the one or more linear stators 230 of the magnetic levitation assembly 120 include a set of electromagnets. In light thereof, the one or more linear stators 230 are active magnetic systems that can provide an adjustable, controllable magnetic field. For example, each stator pole 232 of the linear stator 230 may include an electromagnet. The electromagnet may include a respective coil wound around each stator pole 232. Different winding schemes for winding the coils around each stator pole 232 may be provided. For example, the coils may be wound vertically, in that the coils are wound from top to bottom (clockwise) or from bottom to top (counter-clockwise). In some embodiments, the magnetic levitation element 240 may not include an electromagnet. The magnetic levitation element 240 may be a magnetically passive system, wherein the magnetic levitation element 240 is formed from a ferromagnetic material (e.g., permanent magnet, soft ferromagnetic iron), without any electromagnets mounted thereon. In some embodiments, the magnetic levitation element 240, or at least the features 250 formed thereon, include a ferromagnetic material such as a material selected from a group comprising transition metals (e.g., iron, nickel, cobalt) and their alloys, and alloys of rare-earth metals. In one example, the magnetic levitation element 240 includes a ferritic stainless steel, such as a 409, 430 and 439 stainless steel. The magnetic levitation element 240 may also include an electrical steel, silicon steel, martensitic steel, or any other soft magnetic material.

In some embodiments, the magnetic levitation assembly 120 includes two parallel magnetic levitation actuator assemblies 120A running in the X-direction configured to levitate carrier 130 and convey the carrier 130 in either the positive or negative X-direction. The carrier 130 similarly includes two parallel magnetic levitation elements 240 running in the X-direction. Each magnetic levitation element 240 is positioned on the carrier 130 to be underneath the one or more linear stators 230 of a respective magnetic levitation actuator assembly 120A running in the X-direction when the carrier is being conveyed in the X-direction. Additionally, the magnetic levitation assembly 120 may also include two parallel magnetic levitation actuator assemblies 120A running in the Y-direction configured to levitate the carrier 130 and convey the carrier 130 in either the positive or negative Y-direction. The carrier 130 similarly includes two parallel magnetic levitation elements 240 running in the Y-direction. Each magnetic levitation element 240 is positioned on the carrier 130 to be underneath the one or more linear stators 230 of a respective magnetic levitation actuator assembly 120A running in the Y-direction when the carrier 130 is being conveyed in the Y-direction. As the carrier 130 moves in the Y-direction, the magnetic levitation elements 240 running in X-direction move out of alignment with the corresponding magnetic levitation actuator assemblies 120A running in the X-direction. The magnetic levitation actuator assemblies 120A running in the Y-direction are able to maintain levitation as the carrier 130 is moved in the Y-direction. The carrier 130 may be conveyed in the Y-direction to another station (e.g., from the fourth station 114 to the fifth station 115) until the magnetic levitation elements 240 running in the X-direction become aligned with corresponding magnetic levitation actuator assemblies 120A running in the X-direction where the carrier 130 may then be conveyed again in the X-direction.

The process station 205 may include the controller 150. In some embodiments, each process station 205 has its own controller 150 that is connected to a central controller of the substrate processing system 100. The controller 150 may be connected to the set of electromagnets of the linear stators 230 for controlling a current in the electromagnets, and thus the strength of the magnetic field generated by linear stators 230. The current can be increased to increase the attraction force of the set of electromagnets to raise the carrier 130 or decreased to lessen the attraction force of the set of the electromagnets to lower the carrier 130.

The controller 150 as described herein may be a single centralized controller or may be a distributed controller including a plurality of individual control units. The controller 150 may include a central processing unit (CPU), a memory and, for example, support circuits. To facilitate control of the carrier 130, the CPU may be one of any form of general-purpose computer processor that can be used in an industrial setting for controlling various components and sub-processors. The memory may be coupled to the CPU. The memory, or a computer readable medium, may be one or more readily available memory devices such as random-access memory, read only memory, a floppy disk, a hard disk, or any other form of digital storage either local or remote. The support circuits may be coupled to the CPU for supporting the processor in a conventional manner. The circuits in question include cache, power supplies, clock circuits, input/output circuitry and related subsystems, and the like. Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various processing module process recipe steps being performed within the system.

The one or more linear stators 230 including the electromagnets may, together with the magnetic levitation element 240, form a linear reluctance motor for providing both a contactless levitation and a contactless drive of the carrier 130. A linear reluctance motor is configured for providing a linear motion, or translational motion, of the carrier 130. A linear motor is distinguished from a rotary motor, which provides a rotational motion. The linear reluctance motor of the apparatus according to embodiments described herein provides a linear motion of the carrier 130 along the magnetic levitation assembly 120.

The process station 205 may include one or more sensors 270 for measuring or detecting a position of the carrier 130 during contactless levitation and/or transportation. In some embodiments, a plurality of sensors 270 are arranged in a linear array (e.g., row) adjacent to the linear array of linear stators 230, such as shown in FIG. 2B. For example, sensors 270 may be provided on opposite ends of each linear stator 230. Each sensor 270 is configured to detect the presence of a portion of the carrier 130. Each sensor 270 is also configured to detect a position of the carrier 130, which may include a vertical position and/or a horizontal position of the carrier 130, for example a horizontal position with respect to the transportation direction. The sensor 270 is a magnetic field detection sensor to detect the position of the carrier 130 through the membrane 206. Each sensor 270 may be connected to the controller 150. The sensor 270 may be high-precision sensor, which have a sensor resolution of 100 μm or less, particularly 10 μm or less, that is used to detect the relative position of a portion of the featureless element 260 of the carrier 130 to the sensor 270. Accordingly, the carrier 130 may be positioned vertically and/or horizontally in a target position with high precision. In some embodiments, the sensors 270 are included in the magnetic levitation assemblies 120.

The process station 205 according to embodiments described herein may include one or more sensors 270 for detecting a position of the carrier 130 with respect to a transportation direction of the carrier 130. The controller 150 may be configured to control the reluctance-based drive force in response to a signal provided by the one or more sensors 270 to position the carrier 130 in a target position with respect to the transportation direction. The reluctance-based drive force may be configured to align the carrier 130 along the magnetic levitation element 240 or transport direction. By controlling amplitude and phase angle of an AC signal provided to the coils coupled to the stator poles 232, the dynamic motion characteristics of the magnetic levitation elements 240 and thus the carrier 130, such as the amount of jerk, acceleration, velocity, and finally horizontal position can be adjusted and achieved. The controller 150 may cause the magnetic levitation assembly 120 to adjust the roll, pitch, and/or yaw of the carrier 130 if the sensors 270 detect that the carrier 130 is not level, such as having an unacceptable roll, pitch, and/or yaw. The controller 150 may also cause the magnetic levitation assembly 120 to maintain the carrier 130 in a level orientation as it passes through the second region 208. In some embodiments, three or more sensors 270 located above different portions of the carrier 130 may be used to detect orientation of the carrier 130, such as the roll, pitch, and/or yaw of the carrier 130. The controller 150 may instruct the magnetic levitation assembly 120 to adjust the position of the carrier in the X and/or Y direction if the sensors 270 detect the carrier 130 is out of a desired alignment in the X and/or Y directions. The controller 150 may instruct the magnetic levitation assembly 120 to change the position of the carrier in the Z-direction based on the sensors 270, such as raising and lowering to carrier relative to the membrane 206 to adjust or maintain a gap between the carrier 130 and the membrane 206. For example, the controller may reduce the electrical current to the set of electromagnets of the linear stators 230 to lower the carrier 130 in the Z-direction and may increase the current to the set of electromagnets of the linear stators 230 to raise the carrier 130 in the Z-direction. In some embodiments, the carrier 130 is maintained at a desired position in the Z-direction, such as maintaining the carrier 130 in a level orientation, by adjusting the current to the linear stators 230 in responses to changes in position of the carrier 130 detected by the sensors 270. Thus, the controller 150 may respond to the position of the carrier 130 detected by each sensor 270 to adjust a position of the carrier 130 in the X, Y, and/or Z directions at different positions of the carrier 130 and/or to control the orientation of the carrier 130.

FIG. 2C illustrates a schematic partial cross-sectional view of the portion 200 to illustrate the magnetic levitation actuator assembly 120a and carrier 130. The sensors 270 and stators 230 are shown adjacent one another in the Y-direction. The sensor 270 and stator 230 are each attached to a frame member 220 of the magnetic levitation actuator assembly 120a. The frame member 220 may extend along the x-direction above the membrane 206. A plurality of stators 230 may be attached to the frame member 220 arranged in a linear array (e.g., row) that is parallel to a linear array of sensors 270 attached to the frame member 220. The frame member 220 may be attached to a wall of the process station 205 in the first region 207 to maintain a fixed distance between the top side of the membrane 206 and the sensor 270 and the stator 230. In some embodiments, sensor 270 is positioned over the membrane 206 or in a recess formed in the membrane 206 such that the sensor 270 is not in contact with the membrane. In other words, a clearance 271 may be present between the membrane 206 and the sensor 270.

The stator 230 is shown in FIG. 2C directly above the one or more features 250 of the magnetic levitation element 240 that are located on the other side of the membrane 206. The sensor 270 is positioned adjacent to the stator 230 and is directly above the featureless element 260. A gap G1 is present between the featureless element 260 and the membrane 206. The featureless element 260 provides a uniform surface for the sensor 270 to detect. The sensor 270, which positioned a fixed distance from the membrane 206, is able to detect changes in the size of the gap G1 (e.g., distance between the underside 211 of the membrane 206 and the upper surface 261 of the featureless element 260) through the membrane 206 such that the controller 150 is able to determine the position of the carrier 130 underneath the sensor 270 in the Z-direction. In other words, the sensors 270 may be used to determine the vertical position of the carrier 130 within the second region 208. In some embodiments, the sensor 270 may have one or more magnets and one or more magnetic field sensor elements that are able to detect changes in magnetic flux density of a magnetic field generated by the one or more magnets in the sensor 270 as the size of the gap G1 changes. The sensor 270 is able to correlate the detected magnetic flux density, such as a voltage signal produced in response to a detected magnetic flux density, with the size of the gap G1. The magnetic field sensor element may be a Hall Effect element, a giant magnetoresistance (GMR) element, a tunnel magnetoresistance (TMR) element, or other suitable magnetic field sensor element. It has been found that GMR and/or TMR sensors produce a signal with less noise and are more sensitive than a Hall Effect sensor element providing higher Signal-to-Noise-Ratio (SNR).

The size of the gap G1 modulates the magnetic field of the one or more magnets of the sensor 270 so that the magnetic flux density detected by the one or more magnetic field sensor element varies based on the size of the gap G1. The configuration of the magnets and relative position of the magnetic field sensor elements to the magnets affects whether increasing the size of the gap G1 increases or decreases the magnetic flux density measured by the magnetic field sensor elements. The sensor 270 may convert the magnetic flux density detected by the sensor elements into a voltage signal that can be used by the controller 150 or processor on the magnetic sensor 270 to determine the size of the gap G1. The dimension of the gap G1 may be determined by correlating the voltage signal generated by the magnetic sensor 270 to the size of the gap G1. For example, controller 150 may have a lookup table stored in the memory that indexes the voltage of the voltage signal to a corresponding size of the gap G1.

The one or more magnetic field sensor elements of sensor 270 may measure one or more components of a magnetic flux density vector, such as the x-component of the magnetic flux density vector, to determine the size of the gap G1. For example, the magnetic field sensor elements may measure the x-component of the magnetic flux density vector to determine the size of the gap G1.

The controller 150 may control the position of the carrier 130 in the Z-direction based on the size of the gap G1 detected by the sensors 270. In some embodiments, the controller 150 may adjust the current to the linear stators to maintain the size of the gap G1. For example, the gap G1 may be maintained at a distance less than 10 mm, such as 9 mm, such as 8 mm, such as 7 mm, such as 6 mm, such as 5 mm, such as 4 mm, such as 3 mm, such as 2 mm, such as 1 mm. In some embodiments, the process station 205 is arranged such that the gap G1 is in either the X-direction or Y-direction rather than the Z-direction. The sensor 270 may be used to control the size of the gap G1 in the X-direction and/or Y-direction.

The controller 150 may maintain the size of the gap G1 by closed loop control. For example, the controller 150 may have a desired distance of the gap G1 as a stored value, such as a gap distance of 5 mm. The controller 150 may use the sensors 270 to determine the size of the gap G1 present between the membrane 206 and the featureless element 260. If the detected size is equal to the stored value, then the controller 150 does not cause the stators 230 to adjust the z-position of the carrier 130. In some embodiments, the controller 150 may increase the current to one or more stators 230 if the gap G1 is greater than the stored value to lift the carrier 130 to adjust the gap G1 to the stored value. Similarly, the controller 150 may decrease the current to one or more stators 230 if the gap G1 is less than the stored value to lower the carrier 130 to adjust the gap G1 to the stored value.

In some embodiments, the controller 150 may also not cause the linear stators 230 to adjust the z-position of the carrier 130 if the detected size is within a threshold range of the stored value. For example, the threshold range may be 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0 mm. In other words, the controller 150 may not adjust the z-position of the carrier 130 if the detected position is within the threshold range, such as being within plus or minus 0.5 mm of 5 mm as an example. If the controller 150 determines that the detected position is outside of the threshold range, then the controller 150 causes the stators 230 to adjust the z-position of the carrier 130 to return the size of the gap G1 to the stored value.

Additionally, the gap size detected by each sensor 270 may differ if the carrier 130 is not level. The controller 150 may use the distance detected by each sensor 270 to adjust the pitch or tilt of the carrier 130 to return the carrier 130 to a level orientation. This process may repeat cyclically during the operation of the process station 205 to maintain the desired size of the gap G1, and thus z-position of the carrier 130.

The process station 205 includes a substrate support 209 disposed below the processing chamber 201. The processing chamber 201 includes a process kit assembly 202, and a source assembly 203. As shown, the substrate support 209 is disposed below the process kit assembly 202 and source assembly 203. The carrier 130 is shown in a park position, as indicated by the reference sign 208A, within the second region 208. The carrier 130 is moveable to a transfer position 208B (shown in dashed lines and indicated by reference sign 208B) above the substrate support 209. The park position 208A and transfer position 208B are each discrete carrier positions. In other words, the process station 205 may have two discrete carrier positions (e.g., one park position 208A and one transfer position 208B) in some embodiments.

The substrate support 209 is moveable in the Z-direction within the second region 208 to one or more positions. While the carrier is moving within the process station 205, the substrate support 209 may be positioned in a lower position to allow the carrier 130 to move through and/or to one or more positions within the second region 208 without contacting the substrate support 209.

The carrier 130 is moved to the transfer position 208B above the substrate support 209 to facilitate the transfer of the object 140 on the carrier 130 to lift pins of the substrate support 209. The carrier 130 is then moved to the park position 208A (e.g., position opposite to the transfer position) after the object 140 is transferred to the lift pins. The carrier 130 is clear from the substrate support 209 when in the park position 208A to allow the substrate support 209 to move vertically from the lower position to a process position with the transferred object 140 disposed thereon.

The substrate support 209 is engaged with the process kit assembly 202 when in the process position. In some embodiments, the process kit assembly 202 includes one or more components to seal against the substrate support 209 when the substrate support 209 is in the process position. For example, the substrate support 209 and process kit assembly 202 may at least partially define the process region 204 within the process station 205 where the substrate 140 is subjected to a process performed by the source assembly 203. The process region 204, which is defined by surfaces of the substrate 140, the substrate support 209, the process kit assembly 202 and the source assembly 203, is isolated from the second region 208 when the substrate support 209 is in the process position. For example, the source assembly 203 may be configured to deposit a layer via a physical vapor deposition (PVD) process onto the substrate 140. Once the process performed by the source assembly 203 is complete, the substrate support 209 is lowered from the process position to a lower position to allow the carrier 130 to return to the transfer position 208B where the substrate 140 is transferred from the lift pins back onto the carrier 130.

The source assembly 203 may be adapted to perform a physical vapor deposition ("PVD"), chemical vapor deposition ("CVD"), plasma enhanced chemical vapor deposition ("PECVD"), atomic layer deposition ("ALD"), plasma enhanced atomic layer deposition ("PEALD"), etch, lithography, ion implantation, ashing, cleaning, thermal process (e.g., rapid thermal processing, anneal, cool down, thermal management control) degas, and/or other useful substrate processes.

In some embodiments, the process station 205 may include an equipment assembly 210. In some embodiments, the carrier 130 is positioned beneath the equipment assembly 210 when in the park position 208A. In some embodiments, the carrier 130 is positioned above the equipment assembly 210 when in the park position 208A. In some embodiments, a first portion of the equipment assembly 210 may be below the carrier 130 while a second portion of the equipment assembly 210 is above the carrier 130 when the carrier 130 is in the park position 208A. In some embodiments, the equipment assembly 210 may be at least partially disposed in and/or over the second region 208. In other words, the equipment assembly 210 may not be positioned behind the membrane 206.

The equipment assembly 210 may include one or more components to perform a process on the object 140 while the carrier 130 is in the park position 208A. In some embodiments, the equipment assembly 210 may include one or more heating sources, such as LED heat sources, to adjust the temperature of the substrate 140 prior to or after processing in the process region 204 by the source assembly 203. The one or more heat sources may be disposed below the parked carrier 130. For example, the one or more heating sources may be used to perform a degas operation. In some embodiments, the equipment assembly 210 may also be configured to cool the substrate 140 and the carrier 130, such as including one or more shower head or nozzles to direct a cooling gas towards one or more portion of the substrate. In some embodiments, the equipment assembly 210 may be configured to treat the substrate 140 with a precursor for a process that will subsequently occur within the process chamber 201. For example, the equipment assembly 210 may include one or more shower heads to direct a precursor, such as a gas, towards one or more portions of the substrate 140. In some embodiments, the equipment assembly 210 may be configured to perform a carrier cleaning operation on the parked carrier 130, such as directing a cleaning gas (e.g., ozone) at the carrier 130 using one or more shower heads or nozzles. The carrier 130 may be cleaned while the substrate 140 is processed within the process chamber 201. In some embodiments, the substrate support 209 may be raised into engagement with the process kit assembly 202 to isolate the processing region 204 from the remainder of the second region 208 while a process is completed with the equipment assembly 210.

In some embodiments, the equipment assembly 210 may include one or more sensors, such as an array of different sensors. For example, the equipment assembly 210 may include a temperature sensor, a film composition sensor (e.g., FTIR assembly), a particle detection assembly, a location center finder ("LCF") sensor, a residual gas analyzer (RGA), a camera, a substrate curvature sensor to measure bowing of the substrate 140 (e.g., a LayTech sensor), a position sensor, or any other suitable sensor. In some embodiments, the equipment assembly 210 is a metrology unit.

Once the carrier 130 is in the park position 208A, the controller 150 may cause the stators 230 to land the carrier 130 on the bottom of the processing chamber 205 or on a landing rail assembly disposed in the second region 208. In some embodiments, the carrier 130 may be landed while a process is performed in the processing region 204. In some embodiments, the carrier 130 is levitated while in the park position 208A while a process is performed in the processing region 204. In some embodiments, the carrier 130 may be landed in the park positon 208A to facilitate using the equipment assembly 210. In some embodiments, the equipment assembly 210 may perform a process while the carrier 130 is levitated underneath the equipment assembly 210 in the park position 208A.

In some embodiments, the membrane 206 may have an opening allowing the substrate support 209 to be raised upward toward the process chamber 201 into engagement with the processing kit assembly 202. In some embodiments, the process station 205 includes one or more separate membranes 206 for each magnetic levitation actuator assembly 120A. The process chamber 201 and equipment assembly 210 may be disposed between separate membranes 206.

The process station 205 according to embodiments described herein may include one or more position sensors for detecting a position of the carrier 130 with respect to a transportation direction of the carrier 130. The controller 150 may be configured to control the reluctance-based drive force in response to a signal provided by one or more sensors to position the carrier 130 in a target position with respect to the transportation direction (e.g., X-direction or Y-direction). The reluctance-based drive force may be configured to align the carrier 130 along the magnetic levitation element 240 or transport direction. By controlling amplitude and phase angle of an AC signal provided to the coils coupled to the stator poles 232, the dynamic motion characteristics of the magnetic levitation elements 240 and thus the carrier 130, such as the amount of jerk, acceleration, velocity, and finally horizontal position can be adjusted and achieved. For example, the position sensors may be used to determine when the carrier 130 reaches the park position 208A or the transfer position 208B within the process station 205.

In some embodiments, the process station 205 is sized such that two carriers 130 may be parked in separate parking positions within the second region 208 while a substrate 140 is processed within the processing chamber 201. In other words, the process station 205 may have three discrete carrier positions, such as a first park position 208A, a second park position 208C, and a transfer position 208B. For example, a first carrier 130 be parked in a second park position (shown in dashed lines and indicated by reference sign 208C) after a first substrate 140 disposed thereon was transferred to the substrate support 209. The first substrate 140 is then processed within the process chamber 201. A second carrier 130 with a second substrate 140 disposed thereon may be in the park position 208A (e.g., in a second park position) underneath the equipment assembly 210. The equipment assembly 210 may perform a process on the second substrate 140 while the first substrate 140 is processed within the process chamber 201. The first substrate 140 is transferred back onto the first carrier 130 after the process within the process chamber 201 is complete. The first carrier 130 then exits the process station 205. The second carrier 130 then moves toward the transfer positon 208B to facilitate the transfer of the second substrate 140 within the process chamber 201. The second carrier 130 is moved to the second park position 208C after the second substrate 140 is transferred to the substrate support 209. A third carrier 130 with a third substrate 140 disposed thereon may enter the chamber, such as entering after the second carrier 130 leaves the park position 208A, and be placed in the park position 208A. The third substrate 140 on the third carrier 130 may be processed by the equipment assembly 210 while the second substrate 140 is processed within the processing chamber 201.

In some embodiments, one or more process stations 205 in a processing line 102 may have multiple process chambers 201 and substrate support 209 for each process chamber 201. For example, the process station 205 may have two process stations 201 and two substrate supports 209. A first carrier 130 and second carrier 130 are conveyed into the process station 205. The first carrier 130 is conveyed past the second substrate support to a first transfer position above the first substrate support 209 to facilitate the transfer of the object 140 disposed thereon onto the first substrate support 209. The first carrier 130 is then moveable to a first park position while the first object 140 is placed in the processing chamber 201, such as when performing a process on a substrate 140. The first carrier 130 returns to the first transfer position to receive the first object 140 from the first substrate support 209. The second carrier 130 with a second object 140 disposed thereon is also conveyed to a second transfer position over the second substrate support 209. The second carrier 130 is conveyed to a second park position after the second object 140 is transferred to the second substrate support 209. The second carrier 130 returns to the second transfer position to receive the first object 140 from the first substrate support 209. The slit valves may be opened to allow the first and second carriers 130 to exit the process station 205 once the respective object 140 is transferred back onto each carrier 130. In some embodiments, the first and second carriers may be moved synchronously within the process station 205. In some embodiments, the first and second carriers are moved asynchronously. Thus, the process station 205 may have four discrete carrier positions (e.g., a first park position, a second park position, a first transfer position, and a second transfer position). Additionally, the process station 205 may include an equipment assembly 210 for each process chamber 201. In other words, the first carrier 130 may be parked in the first park position underneath a first equipment assembly 210 prior to moving to the first transfer position and the second carrier 130 may be parked in the second park position underneath a second equipment assembly 210 prior to the second transfer assembly.

FIG. 3 illustrates an example carrier 300 that includes a base 310 and the magnetic levitation elements 240 of FIGS. 2A-2B, in accordance with embodiments of the present disclosure. In some embodiments, the carrier 130 described above may be implemented as the carrier 300. The carrier 300 of FIG. 3 may be similar to the carrier 130 of FIGS. 2A-2C, and everything discussed herein with respect to the carrier 130 may also apply to the carrier 300.

In some embodiments, the magnetic levitation element 240 of the carrier 300 may be coupled to the base 310. The carrier 300 may also include an opening 330 in the base 310. The carrier 300 may further include one or more substrate support members 342 coupled to the base 310 to support the object 140. Although the object 140 is illustrated in FIG. 3 as a substrate, the carrier 300 may also be configured to carry other objects. For example, the carrier may be configured to carry a mask, shutter, process kits parts, or other objects used in semiconductor processing, as described above. The carrier 300 may also be configured to transport shutter or process kits parts.

In some embodiments, the magnetic levitation element 240 may include or be implemented as one or more rails (e.g., rails 242, 244, 246, 248). The rails 242, 244, 246, 248 may each be aligned in a certain direction relative to the base 310. In some cases, the magnetic levitation element 240 of the carrier 300 may include a first rail 242 aligned in a first direction (e.g., the X-direction). The magnetic levitation element 240 may also include a second rail 244 aligned in a second direction (e.g., the Y-direction). The magnetic levitation element 240 may also include a third rail 246 aligned in the Y-direction and is aligned parallel to the second rail 244. The magnetic levitation element 240 may also include a fourth rail 248 aligned in the X-direction, and is aligned parallel to the first rail 242. Although the carrier 300 in FIG. 3 is illustrated as having four rails 242, 244, 246, 248, however, any number of rails may be used in the carrier 300. In some cases, the carrier 300 may include just the first rail 242 aligned in the X-direction and the second rail 244 aligned in the Y-direction.

The dimensions of the carrier 300 (including the base 310 and the rails 242, 244, 246, 248) may be based on at least one of the size of the stations 111-118, the location of the sensors 270 in the stations 111-118, or the size of the objects (e.g., the object 140) being transported by the carrier 300. The dimensions of the carrier 300 may also be selected to facilitate the stability of the carrier 300 during transportation of the object(s) 140, as well as ensure the stability of the carrier 300 when nothing is transported. The carrier 300 may be also be configured to be large enough to support the object 140 (or multiple objects 140, as described below) and small enough to pass into, through, and out of stations (e.g., stations 111-118) of a substrate processing system (e.g., substrate processing system 100), as described above.

The features 250 may be arranged on the rails 242, 244, 246, 248. In some embodiments, a pitch and/or spacing may be provided between adjacent features 250, as described above. The features 250 may also be arrange side by side. As illustrated in FIG. 3, the array of features 250 of the first rail 242 may be aligned in the X-direction along a surface of the first rail 242, the array of features 250 of the second rail 244 may be aligned in the Y-direction along a surface of the second rail 244, the array of features 250 of the third rail 246 may be aligned in the Y-direction along a surface of the third rail 246, and the array of features 250 of the fourth rail 248 may be aligned in the X-direction along a surface of the fourth rail 248. In some embodiments, the features 250 may be arranged linearly. A space between each feature may vary between features 250, or may be the same along the rails 242, 244, 246, 248.

In some embodiments, the features 250 of the rails 242, 244, 246, 248 may cover a portion of the top of the carrier 130. The featureless element 260 of the magnetic levitation elements 240 is shown adjacent to the features 250 of each rail 242, 244, 246, 248. The featureless element 260 may be included on the top of one or more of the rails 242, 244, 246, 248 of the carrier 300, and may be implemented as a featureless track that is aligned with the array of features 250. In some embodiments, the magnetic levitation elements 240 may each include an outer portion and an inner portion. In these embodiments, the features 250 may be located on one or more outer portions of the magnetic levitation elements 240 and the featureless element 260 may be located on one or more inner portions of the magnetic levitation elements 240, as illustrated in FIG. 3. In some embodiments, the featureless element 260 may be a featureless portion of a surface of the magnetic levitation element 240 rather than being an element embedded on or attached to the magnetic levitation element 240. In some embodiments, at least a portion of the base 310 may be featureless and may be planar (e.g., substantially flat) and configured to enable the sensors 270 to measure and/or or detect a position of the carrier 300 during contactless levitation and/or transportation. That is, at least a portion of the base 310 may function as the featureless element 260.

The base 310 of the carrier 300 may be formed from a non-magnetic material and vacuum compatible material, such as metal (e.g., aluminum (Al), non-magnetic stainless steel (e.g., 316 SST) or titanium (Ti)). In some embodiments, it is beneficial to select the material from which the carrier 300 is made to include a material that can also withstand high processing temperatures. In one example, the substrate carrier 300 is made from a ceramic material (e.g., alumina, quartz, zirconia, etc.). In some cases, the substrate carrier 300 may be coated with an electrically conductive coating to resolve any charge build-up issues in the substrate carrier 300 during processing within the process station 205. In some embodiments, the rails 242, 244, 246, 248 may include a magnetic material, and the base 310 may not include a magnetic material. By using a different material in the base 310 than the rails 242, 244, 246, 248, the carrier 300 may be configured to be lighter, and/or may be cheaper to manufacture. In some embodiments, the base 310 may be made from the same material as the rails 242, 244, 246, 248. For example, the base 310 and the rails 242, 244, 246, 248, including the featureless element 260, may be made of magnetic stainless steel.

The carrier may include one or more array of legs 320 disposed underneath the base 310. Each leg 320 has a foot 321 engageable with a landing rail (see landing rail assembly 460 in FIG. 4) disposed in the process station 205 underneath the magnetic levitation actuator assemblies 120A and membrane 206. The carrier 300 is conveyed in the second region 208 between the membrane 206 and the landing rails. The carrier 300 may be landed on the landing rails. For example, when levitation of the carrier 300 fails (e.g., power is lost), the carrier 300 may fall, and the feet 321 of the carrier 300 engage the landing rails to maintain the carrier 300 in the upright position. Additionally, the carrier 300 may be landed on the landing rails in the park position 208A, such as being landed in the park position 208A while a process is performed in the processing region 204. The legs 320 may be electrically coupled to one or more rails 242, 244, 246, 248 and may be configured to electrically ground the carrier 300 when the feet 321 of the carrier 300 are engaged with the landing rails.

The carrier 300 may have multiple arrays of legs 320 in the X-direction and multiple array of legs 320 in the Y-direction. In some embodiments, the carrier 300 has two arrays of legs 320 in the X-direction and two arrays of legs 320 in the Y-direction. The first pair of arrays of legs 320 are engageable with a corresponding landing rail of a first pair of landing rails that run in the X-direction. Each array of legs 320 in the first pair of arrays of legs 320 may be disposed underneath a magnetic levitation element 240 running in the X-direction. Each landing rail of the first pair of landing rails is disposed under a different magnetic levitation actuator assembly 120A. The second pair of arrays of legs 320 are engageable with a corresponding landing rail of a second pair of landing rails that run in the Y-direction. Each array of legs 320 in the second pair of arrays of legs 320 may be disposed underneath a magnetic levitation element 240 running in the Y-direction.

The base 310 of the carrier 300 has two wings on attached to each side. A first wing 360 is attached to the base 310 on one side. A second wing 365 is attached to the base on the opposite side. As shown in FIG. 3, the first wing 360 and the second wing 365 each has magnetic levitation elements 240 disposed thereon. For example, first wing 360 includes rail 248 and second wing 365 includes rail 242. The first wing 360 and the second wing 365 each have a side surface. Each wing 360, 365 has first end 361 and a second end 362. A portion of the base 310 is disposed between the first wing 360 and the second wing 365. The rails 244, 246 are disposed on the portion of the base 310 extending between the first wing 360 and the second wing 365. The rails 244, 246 may be partially disposed on at least one of the wings 360, 365.

Figure 4:
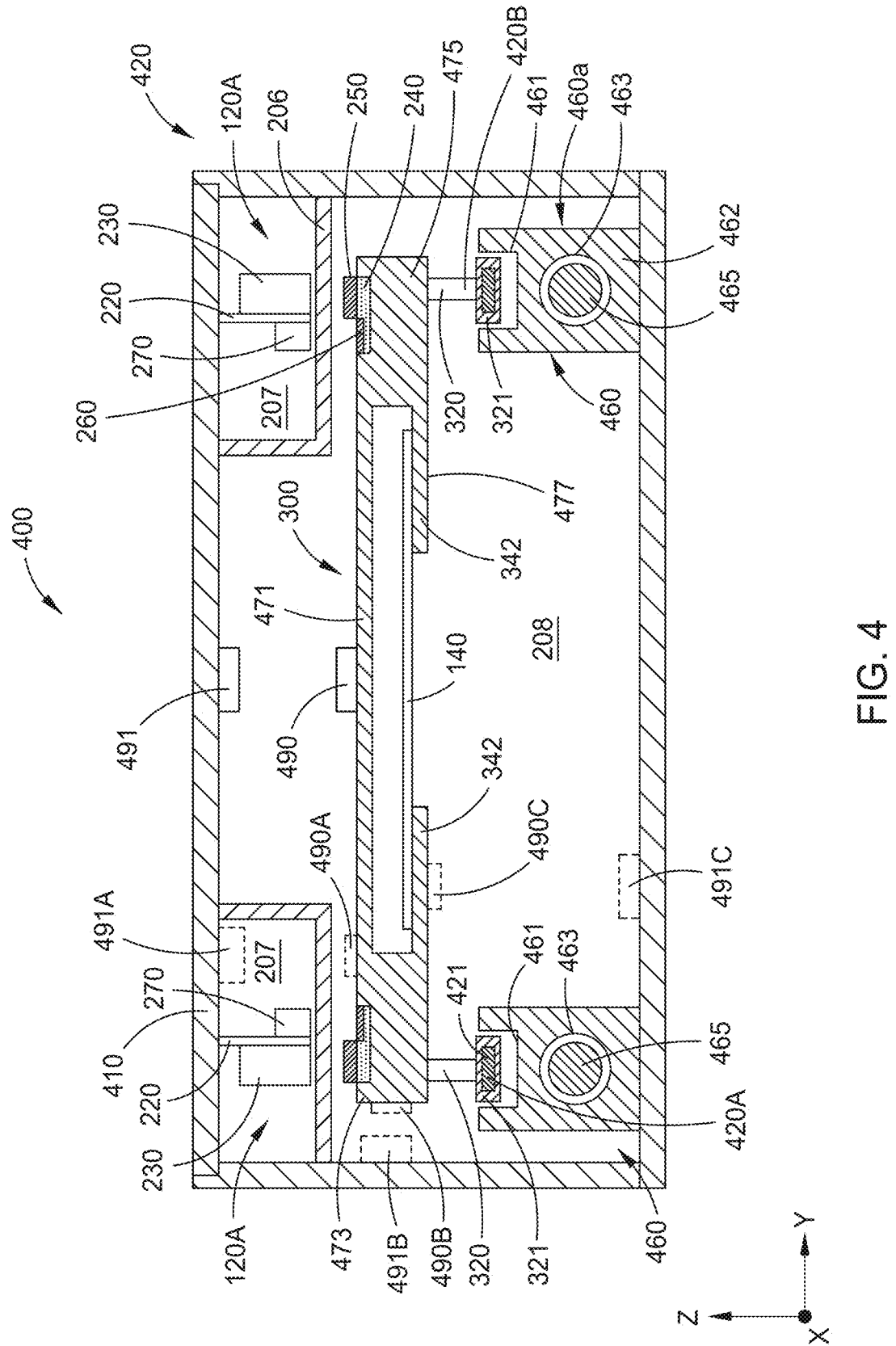
FIG. 4 illustrates a side cross-sectional view of an exemplary process station of the substrate processing system illustrated in FIG. 1, in accordance with embodiments of the present disclosure.

FIG. 4 illustrates a side cross-sectional view of an exemplary process station 400, in accordance with embodiments of the present disclosure. The process station 400 may be used in the place of process stations 112, 113, 116, and 117 of the substrate processing system 100. The process station 400 has similar components of the process station 205 as indicated by the reference signs without reciting the description of these components of the process station 400 for brevity.

An X-Y-Z coordinate system is included in FIG. 4 to illustrate the axial direction of travel (e.g., X-direction) of components of the process station 400 and the carrier 300 being conveyed within a second region 208 (e.g., transport region) of the process station 400. The cross-section is orthogonal to the X-direction showing both sides of the carrier 300. The cross-section shows the carrier 300 in a parking position within the second region 208 of the processing station 400. The carrier 300 may be moved to the parking position before or after processing the object 140 disposed on the carrier 300 within a processing region in the processing station 400.

The process station 400 includes a housing 410, a magnetic levitation assembly 420, and landing rail assemblies 460. In some embodiments, the process station 400 includes one or more membranes 206, such as the two membranes 206 shown in FIG. 4. Other items that would be present in the process station 400 but not necessary to describe the disclosure are omitted. The controller 150 is in communication with the process station 400 and controls the one or more components of the process station 400.

The second region 208 is an interior chamber formed within the housing 410 and extends to an opening on both ends of the station 400 that can be selectively blocked by a slit valve. The carrier 300 is conveyed within the second region 208 to one or more positions by the magnetic levitation assembly 420. The second region 208 is partially defined by one or more inner surfaces of the walls of the housing 410 and the membranes 206. In some embodiments, the landing rail assemblies 460 are disposed within the second region 208. The second region 208 may be in communication with a vacuum pump to evacuate the second region 208. For example, the vacuum pump may reduce the pressure within the second region 208 to a sub-atmospheric pressure on the order of about $10^{-3}$ torr. The vacuum pump may be a turbopump, cryopump, roughing pump or other useful device that is able to maintain a desired pressure within the second region 208.

As shown in FIG. 4, the processing station 400 includes two membranes 206 disposed on opposing sides of the housing 410. Each membrane 206 is coupled to the housing 410. The housing 410 and each membrane 206 defines a first region 207 of the processing station 400. In other words, and as shown in FIG. 4, the processing station 400 has two first regions 207 isolated from the second region 208 by different membranes 206.

The magnetic levitation assembly 420 includes at least two magnetic levitation actuator assemblies 120A. Each magnetic levitation actuator assembly 120A is disposed in one of the first regions 207. Each magnetic levitation actuator assembly 120A is oriented within the first region 207 so that the linear stators 230 are positioned above and aligned the corresponding array of features 250 of the carrier 300. Similarly, each magnetic levitation actuator assembly 120A is oriented within the first region 207 to be positioned above and aligned with the featureless element 260 of the carrier 300. The carrier 300 is conveyed in the positive and negative transportation direction (shown as X-direction in FIG. 4) within the second region 208 by the stators 230 of the magnetic levitation actuator assemblies 120A.

The magnetic levitation actuator assembly 120A in the first region 207 located on the right side of the process station 400 is a mirror image of the magnetic levitation actuator assembly 120A in the first region 207 on the left hand side of the process station 400. In some embodiments, both magnetic levitation actuator assemblies 120A may have the same components. In other embodiments, the magnetic levitation actuator assembly 120A have one or more different components.

The landing rail assembly 460 for each array of legs 320 is disposed within the process station 400. As shown in FIG. 4, each landing rail assembly 460 is positioned within the second region 208 underneath a different array of legs 320. Additionally, the landing rail assemblies 460 are shown underneath one of the membranes 206. The landing rail assemblies 460 make up a landing rail system 460*a* that the carrier 300 can land on within the second region 208 at a level orientation.

Each landing rail assembly 460 includes a landing rail 461. Each landing rail 461 is configured to receive the feet 321 when the carrier 300 is lowered into engagement with the landing rail 461. Each landing rail assembly 460 may include a body 462. In some embodiments, the landing rail 461 is a groove formed in the upper surface of the body 462, the groove extending at least the length of the above magnetic levitation actuator assembly 120A, such as extending in the X-direction as shown in FIG. 4. In some embodiments, the landing rail 461 may be a component that is separate from the body 462 rather than being a groove formed in the upper surface of the body 462. For example, the landing rail 461 may be a rail element disposed on or above the upper surface of the body 462.

The body 462 is partially or fully disposed within the second region 208. The body 462 may be attached to the inner wall of the housing 410 underneath the membrane 206. In some embodiments, the body 462 is formed integrally with the housing 410. The body 462 includes an interior opening 463 that runs the length or part of the length of the body 462 underneath the landing rail 461.

A position sensor 465, in communication with the controller 150, may be disposed in the interior opening 463. The position sensor 465 may be a linear encoder type of position sensor configured to detect a magnet, such as magnet 421 disposed in or on one or more feet 321 in an array of legs 320. In some embodiments the foot 321 may be the magnet 421. Thus, the position sensor 465 may be used to determine the position of the carrier 300 in the transport direction (e.g., X-direction) as the carrier 300 is conveyed within the second region 208. The controller 150 may use the position detected by the position sensor 465 to operate one or more stators 230 of the magnetic levitation actuator assembly 120A to move the carrier 300. The interior opening 463 may be at a different pressure than the second region 208 and may be hermetically sealed from the second region 208. In some embodiments, the interior opening 463 may be at atmospheric pressure or exposed to the atmosphere while the second region 208 is at a vacuum pressure and isolated from the atmosphere.

In some embodiments, the position sensor 465 is a magneto restrictive sensor that includes a waveguide and strain pulse converter. An electric pulse is periodically applied to the waveguide which generates a magnetic field. At least one foot 321 includes a magnet 421, such as the magnet 421 being embedded in foot 321. The magnetic field of the magnet 421 interacts with the magnetic field generated by the waveguide, which causes a torsional strain on the waveguide that propagates a torsional strain pulse through the length of the waveguide to the strain pulse converter at a known velocity. The strain pulse converter uses the time difference between the pulse applied to the waveguide and the received torsional strain pulse to determine the position of the magnet 421 along the waveguide. The position of the magnet 421 is correlated to a position of the carrier 300 within the second region 208 because the position of the magnet 421 relative to the carrier 300 is known.

In some embodiments, only one of the landing rail assemblies 460 running in the X-direction has a position sensor 465. In some embodiments, both the landing rail assemblies 460 running in the X-direction have a position sensor 465. For example, the yaw of the carrier 300 may be determined based on an obtained position from a position sensor 465 in each of the landing rail assemblies 460. The carrier 300 may activate one or more stators 230 in one or both of the magnetic levitation actuator assemblies 120A to adjust the yaw of the carrier 300 based on the positional information obtained from the position sensors 465.

In some embodiments, the landing rail system 460*a* of the process station 400 also includes additional landing rail assemblies 460 positioned to receive an array of legs 320 running in the Y-direction. The controller 150 may use the position sensor 465 in the one or more landing rail assemblies 460 oriented in the Y-direction to determine a position of the carrier 300 in the Y-direction.

Determining the identity of the carrier 300 disposed in the process station 400 helps facilitate the operations being performed in the substrate processing system 100. The controller 150 knows which object 140 is disposed on the carrier 300 upon determining the identity of the carrier 300 since the control system 150 knows which object was disposed on which carrier in the first station 111 (e.g., load lock). The controller 150 may log the processes performed on a substrate 140 based on detecting that the carrier is present within the process station 400. The controller 150 selects the process or operation performed based on the identity of the carrier 300. For example, the object 140 disposed on the carrier 300 may be a shutter disk instead of a substrate. Thus, the controller 150 knows to operate the process station 400 to conduct a cleaning operation, rather than a deposition process on a substrate, to clean buildup within the processing region of the process station 400.

The carrier 300 may have an identification element 490 coupled to the carrier 300. The identification element 490 is unique to the carrier 300, which allows for the identification element 490 to be used to identify which carrier 300 of a plurality of carriers 300 is within a station 400. The identification element 490 may be one or more barcodes, one or more radio-frequency identification (RFID) tags, one or more identifiable physical features (e.g. shapes, numbers, letters inscribed on the carrier), or other suitable device. The identification element 490 may be disposed on a top side 471 of the carrier 300. For example, the identification element 490 may be disposed near the center of the top side 471 of the carrier 300 as shown in FIG. 4.

The processing station 400 further includes an identification sensor 491 configured to detect the identification element 490 to identify which carrier 300 is within the processing station 400. As shown in FIG. 4, the identification sensor 491 is disposed on the upper surface of the housing 410 opposing the identification element 490. The identification sensor 491 may be a barcode reader, an RFID reader, an optical sensor (e.g. camera), or other similar device. The identification sensor 491 corresponds to the type of the identification element 490 used, e.g. a barcode reader to read a barcode, a RFID reader to read a RFID tag, an optical sensor to read an optically identifiable physical feature, etc.

The identification element 490 and identification sensor 491 can be in different orientations and locations. FIG. 4 illustrates an alternative identification element 490A, shown in dashed lines, positioned on the top side 471 of the carrier 300 below one of the membranes 206. An alternative identification sensor 491A, shown in dashed lines, is disposed in the first region 207 and can detect the alternative identification element 490A through the membrane 206. In some embodiments, the alternative identification sensor 491A is positioned on the underside of the membrane 206 and within the second region 208 instead of being positioned within the first region 207.

FIG. 4 illustrates an alternative identification element 490B, shown in dashed lines, that may be disposed on a first side 473 or a second side 475 of the carrier 300. As shown in FIG. 4, the alternative identification element 490B is disposed on the first side 473 of the carrier 300. Opposing the alternative identification element 490B is an alternative identification sensor 491B, shown in dashed lines. As shown in FIG. 4, the alternative identification sensor 491B is disposed on the housing 410 opposing the alternative identification element 490B. In other embodiments, the alternative identification sensor 491B is disposed on the housing 410 within the second region 208 opposing the alternative identification element 490B located on the second side 475. In some embodiments, the alternative identification sensor 491B is disposed within the first region 207 rather than being disposed within the second region 208 as shown in FIG. 4.

FIG. 4 illustrates an additional alternative identification element 490C, shown in dashed lines, that may be disposed on a bottom side 477 of the carrier 300. Opposing the alternative identification element 490C is an alternative identification sensor 491C, shown in dashed lines. As shown in FIG. 4, the alternative identification sensor 491C is disposed on the housing 410 opposing the alternative identification element 490C.

In some embodiments, the identification elements 490 and identifications sensors 491 are positioned to identify the carrier 300 as the carrier 300 is entering or exiting the process chamber 400. For example, the identification sensor 491 may be disposed in the opening of the housing 410 that is selectively covered by a slit valve. In some embodiments, the identification sensor 491 is positioned to detect the identification element 490 when the carrier is positioned at a park position as shown in FIG. 4. In some embodiments, the identification sensor 491 is positioned to detect the identification element 490 when the carrier 300 is in a transfer position above a substrate support at least partially disposed within the housing 410.

As one example, the carrier 300 enters the process station 400 and is conveyed to the park position as shown in FIG. 4 to facilitate identification of the carrier 300 by the identification sensor 491. The carrier 300 is then moved to a transfer position (see transfer position 208B in FIG. 2A) above a substrate support 209 at least partially disposed in the station 400. One or more lift pins of the substrate support 209 are used to lift the substrate 140 off the carrier 300. The carrier 300 then moves to the park position to allow the substrate support 209 with the substrate 140 disposed thereon to be lifted to the process position to place the substrate 140 within the processing region 204 of the process chamber 201. After processing, the substrate support 209 is lowered and the carrier 300 is moved back to the transfer position, where the lift pins are lowered to bring the substrate 140 into engagement with the carrier 300. The carrier 300 then moves out of the processing station 400.

In some embodiments, the carrier 300 is moved to the park position after the substrate object 140 is transferred to the substrate support 209. The identification element 490 of the carrier 300 may be detected while the carrier 300 is in the park position. The identity of the carrier 300 may be used to determine the process parameters used to perform a process in the processing region 204 of the process chamber 201.

In some embodiments, the controller 150 stores the identity of each carrier 300 that has been introduced into the in the processing system 100. The identification sensor 491 is connected to the controller 150. The controller 150 receives a signal from the identification sensor 491 based on the detected identification element 490 to determine which carrier 300 is disposed within the process station 400 at that particular time. The controller 150 may track each carrier 300 as the carriers 300 moves through the substrate processing system 100. Benefits of tracking the identity of the carriers include ensuring the correct process is performed in a processing station 112, 113, 116, 117.

In some embodiments, the process station 400 does not include membranes 206. Instead, the magnetic levitation actuator assemblies 240 are within the transport region 208 (e.g., vacuum chamber, second region).

In some embodiments, the position sensor 465 may be used to identify which carrier 300 is disposed in the processing station. In some embodiments, the carrier 300 may have one magnet, such as magnet 421 disposed in one foot 321 of a first array of legs 320 that is used by a first position sensor 465 to detect the position of the carrier 300 along the transportation direction within the second region 208 of the processing station 400. The carrier 300 may also include at least two additional magnets spaced apart by a unique distance, such as two magnets 421 disposed in different feet 321 of a second array of legs 320, that are used to identify the carrier 300.

In some embodiments, the carrier 300 has two magnets 421 spaced apart by a unique identification distance that can be used to identify which carrier 300 is within the process station 400. For example, a magnet 421 may be disposed in one leg of a first array of legs 420A while a second magnet 421 may be disposed in one leg of a second array of legs 420B. The first and second magnets 421 may be spaced apart along the carrier 300 by the identification distance, such as being spaced apart along the X-direction. For example, a first leg 320 of the first array of legs 420A may include the magnet 421 while a different leg 320 in the second array of legs 420B, such as a third leg, includes the magnet 421. The position sensors 465 shown in process station 400 detect the position of a respective magnet 421 and the controller 150 determines the distance between the two magnets 421 based on the detected position. The detected distance is compared to a list of distances for a plurality of carriers 300 stored in the controller 150 to determine which carrier 300 is disposed in the process station 400. In other words, the identity of the carrier 300 can be determined by at least two position sensors 465 disposed in the same processing station 400. And, in addition to carrier identification, the magnets 421 may also be used to detect the position of the carrier 300 within the second region 208. Thus, the carrier 300 may include two magnets 421 used to detect the identity of the carrier 300 as well as the position of the carrier 300 within the process station 400 along the transportation direction.

In some embodiments, the process station 400 may have a single position sensor 465 to determine the identity of the carrier 300 and the position of the carrier 300. For example, a magnet 421 may be disposed in one leg of the first array of legs 420A while the second magnet 421 may be disposed in a different leg in the first array array of legs 420A. The first and second magnets 421 may be spaced apart along the carrier 300 by the identification distance, such as being spaced apart along the X-direction. The position sensors 465 shown in process station 400 detects the position of each magnet 421 and the controller 150 determines the distance between the two magnets 421 based on the detected position. In some embodiments, the controller 150 measures a time for an electric pulse to travel down the position sensor 465 associated with each magnet 421 to determine the positon of each magnet 421. In other words, the identity of the carrier 300 can be determined by one of the position sensors 465 disposed in the processing station 400. And, in addition to carrier identification, the magnets 421 may be used to detect the position of the carrier 300 within the process station 400 along the transportation direction.

In some embodiments, the spacing of the legs 320 in each array of legs 420A, 420B may vary between carriers 300 to facilitate the spacing of the magnets 421 along the identification distance.

Figure 5:
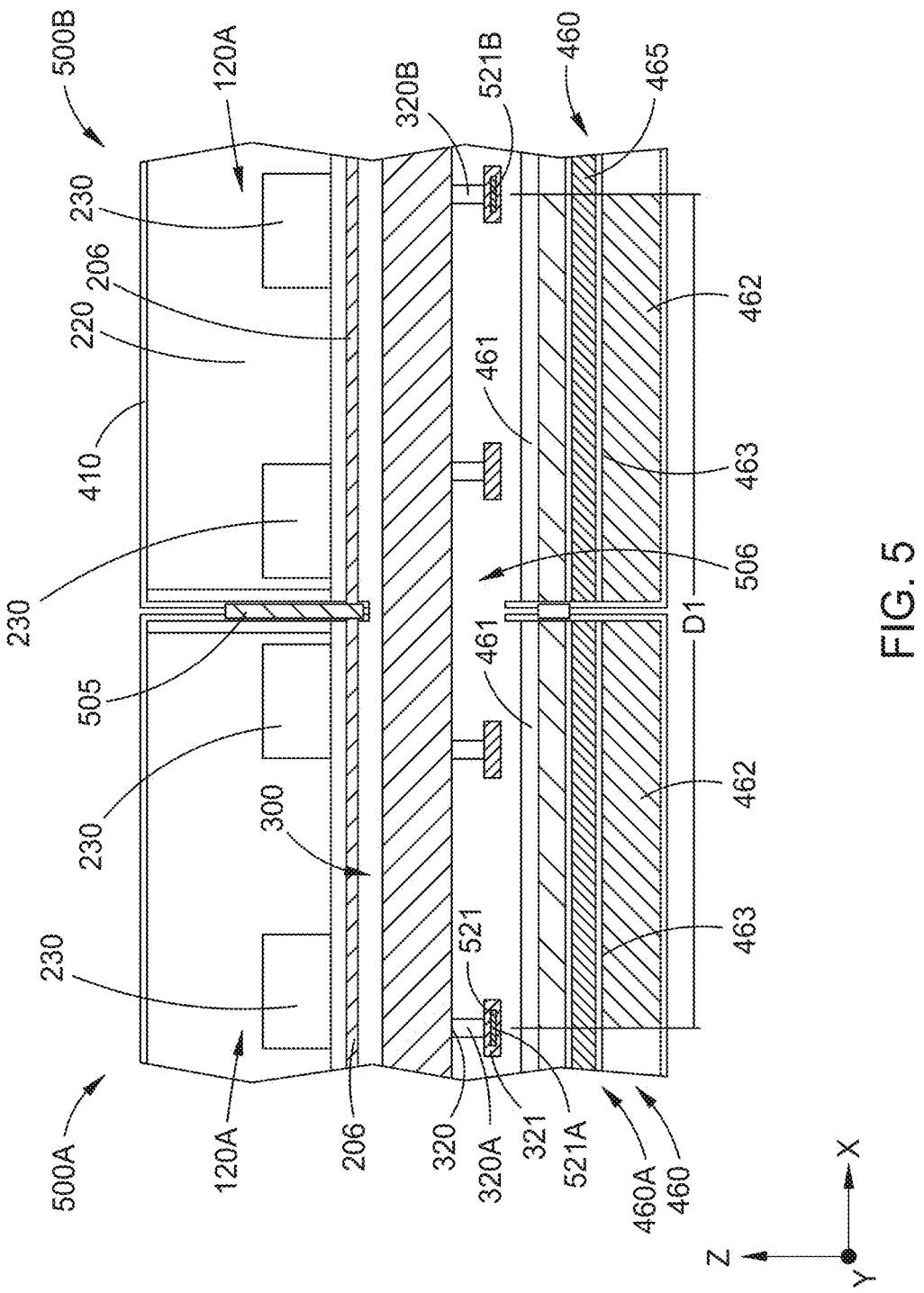
FIG. 5 illustrates a side view of a portion of two example stations of the substrate processing system of FIG. 1, in accordance with embodiments of the present disclosure.

In some embodiments, the identity of the carrier 300 is determined by positioning the carrier 300 in two adjacent processing stations. FIG. 5 illustrates a side cross-sectional view of a portion of two example stations of the substrate processing system of FIG. 1, in which embodiments of the present disclosure may be implemented. The cross-sectional view is orthogonal to the Y-direction. As shown, a carrier 300 is positioned partially within a first process station 500A and a second process station 500B after a slit valve 505 is opened to unblock an opening 506 between the first process station 500A and second process station 500B. The first process station 500A and second process station 500B each have similar components as the process station 205 and process station 400 as indicated by the reference signs without reciting the description of these components of the process station 205 and the process station 400 for brevity. While process stations 500A, 500B are shown with membranes 206, one or both of the process stations 500A, 500B may not have a membrane 206.

FIG. 5 shows a first leg 320A is positioned in the first process station 500A. A second leg 320B is positioned in a second process station 500B. The first leg 320A and the second leg 320B are each legs of a first array of legs 320 of the carrier 300, such as being first and second legs of the first array of legs 420A.

The first leg 320A has a first magnet 521A disposed therein and the second leg 320B has a second magnet 521B disposed therein. The first magnet 521A is separated from the second magnet 521B by a unique identification distance D1. The position sensor 465 in the first station 500A is able to determine the position of the first magnet 521A of the first leg 320A along the transportation direction due to the interaction of the first magnet 521A. Similarly, the position sensor 465 in the second station 500B is able to determine the position of the second magnet 521B of the second leg 320B. The controller 150 is able to use the position of the first leg 320A and the second leg 320B to determine the identification distance D1 between the two legs. The controller 150 compares the distance between the two magnets 521 to a stored (e.g. indexed) group of identification distances D1 associated with each carrier 300 to determine which carrier 300 is partially disposed in both the first station 500A and the second station 500B.

The first array of legs 320 carrier 300 may have more than the two legs 320A, 320B shown in FIG. 5. For example, there may be one or more legs between the legs 320 including the magnets 521A, 521B. However, these legs 320 do not have magnets 521 and are thus not detected by the position sensor 465. In some embodiments, the magnets 521A, 521B may be used to detect the carrier position. In some embodiments, the carrier 300 may have a third leg with a third magnet, such as magnet 421 shown in FIG. 4, disposed therein. The third leg is a leg of the second array of legs 320, such as second array of legs 420B, positioned on an opposite side of the carrier 300 from the first array of legs 420A. The third leg is positionable above the position sensor 465 of another landing rail assembly 460 disposed in the first station 500A and the second station 500B. The third magnet 421 is used to locate the carrier 300 in each process station 500A, 500B while the first magnet 521A and the second magnet 521B determine the identity of the carrier 300.

Figure 6:
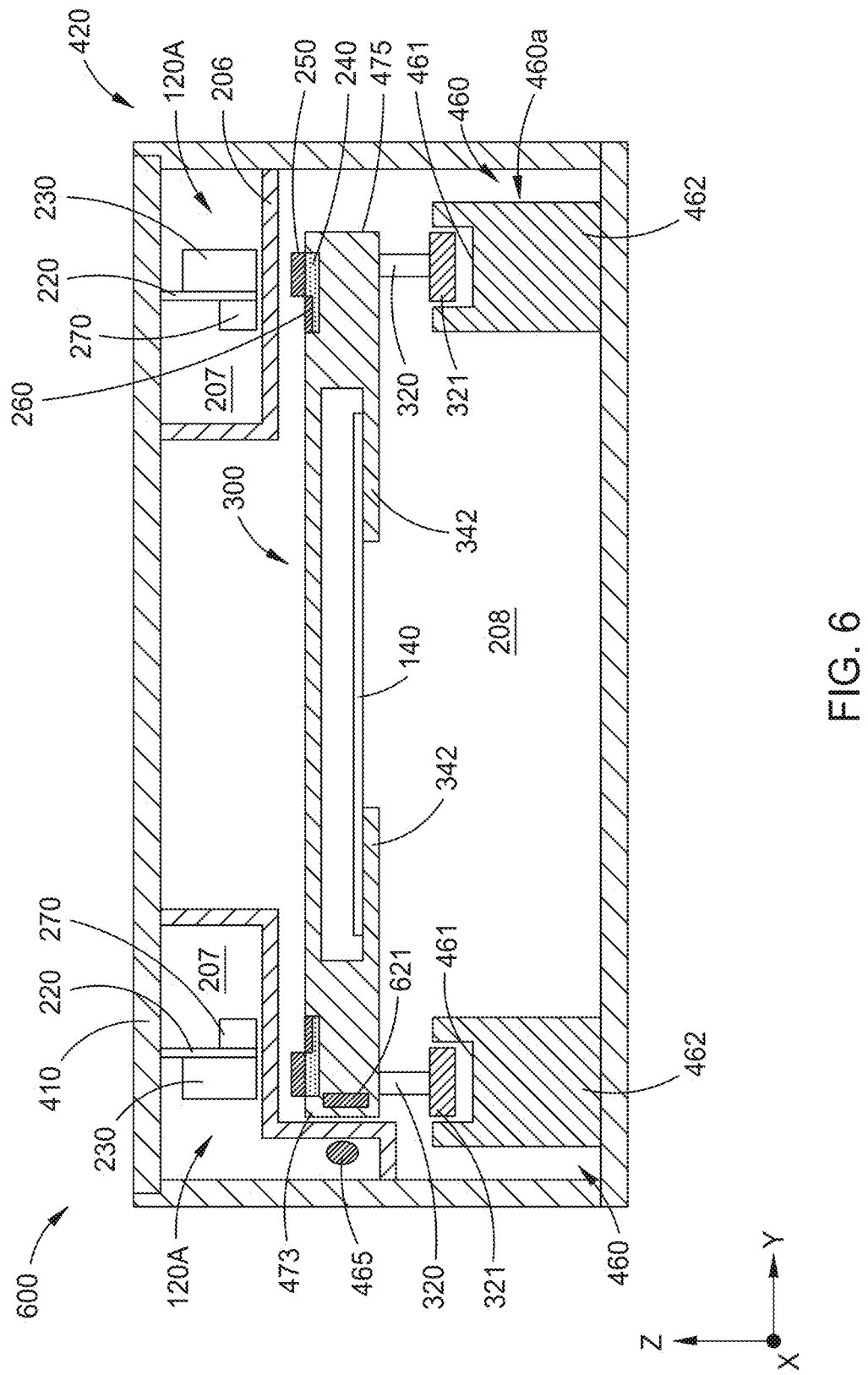
FIG. 6 illustrates a side cross-sectional view of an exemplary process station of the substrate processing system illustrated in FIG. 1, in accordance with embodiments of the present disclosure.

FIG. 6 illustrates a side cross-sectional view of an exemplary process station 600 of the substrate processing system illustrated in FIG. 1, in accordance with embodiments of the present disclosure. The processing station 600 has similar components as the process station 205 and the process station 400 as indicated by the reference signs without reciting the description of these components of the process station 205 and the process station 400 for brevity.

The processing station 600 is similar to processing station 400 of FIG. 4 with the position sensor 465 in an alternative position. The membrane 206 is shaped such that part of the first region 207 opposes the first side 473 of the carrier 300. The position sensor 465 is disposed in the first region 207 across from the first side 473 of the carrier 300. The carrier 300 includes two magnets 621 (one shown) disposed on, embedded, or at least partially embedded in the first side 473 (e.g., left-hand side) that are separated by an identification distance.

In some embodiments, the identification distance between the two magnets 621 may be detected in a similar manner as the first magnet 521A and the second magnet 521B described in FIG. 5, with each magnet 621 being detected by a position sensor 465 disposed in two adjacent processing stations 600. In some embodiments, the carrier 300 may also include a third magnet disposed on the second side 475 of the carrier 300 that is detectable by a position sensor 465 disposed in the other first region 207 of processing station 400. The third magnet may be used to detect a position of the carrier 300 within the second region 208 of the process station 600 rather than being used for identifying the carrier 300. In some embodiments, the third magnet may be disposed in a foot 321 while the magnets used to identify the carrier 300 are disposed on or embedded in a side of the carrier 300.

In some embodiments, the identification distance between the two magnets 421 may be detected by two position sensors 465 disposed in the same processing station 600 rather than using position sensors 465 disposed in two adjacent processing stations. For example, the membrane 206 on the right-hand side of the process station 600 may be shaped similarly to the membrane 206 on the left-hand side. Thus, a position sensor 465 may be disposed in both first regions 207. One position sensor 465 is used to detect a position of a magnet 621 disposed on or at least partially embedded in the first side 473 while the other position sensor 465 is used to detect a position of a magnet 621 disposed on or at least partially embedded in the second side 475. The distance between the magnets 621 on the first side 473 and second side 475, such as the distance in the X-direction, is the identification distance that can be used to identify the carrier 300. Additionally, the position of the carrier 300 may be determined based on the detected position of either one of the two magnets 621. In some embodiments, the carrier 300 may have a third magnet 621 that is detectable by a separate position sensor 465 to determine the position of the carrier 300.

In some embodiments, a single position sensor 465 may be used for carrier identification and for monitoring the carrier position, such as the single position sensor detecting two different magnets disposed on the same side of the carrier 300 separated by an identification distance. In some embodiments, the carrier 300 may have a third magnet 621 that is detectable by a separate position sensor 465 to determine the position of the carrier 300 while the other position sensor 465 is used for identifying the carrier 300.

In some embodiments, process station 600 may not have membranes 206. The magnetic levitation actuation assemblies 120A and position sensor 465 may instead be located in the transport region 208 (e.g., vacuum chamber, second region).

Figure 7:
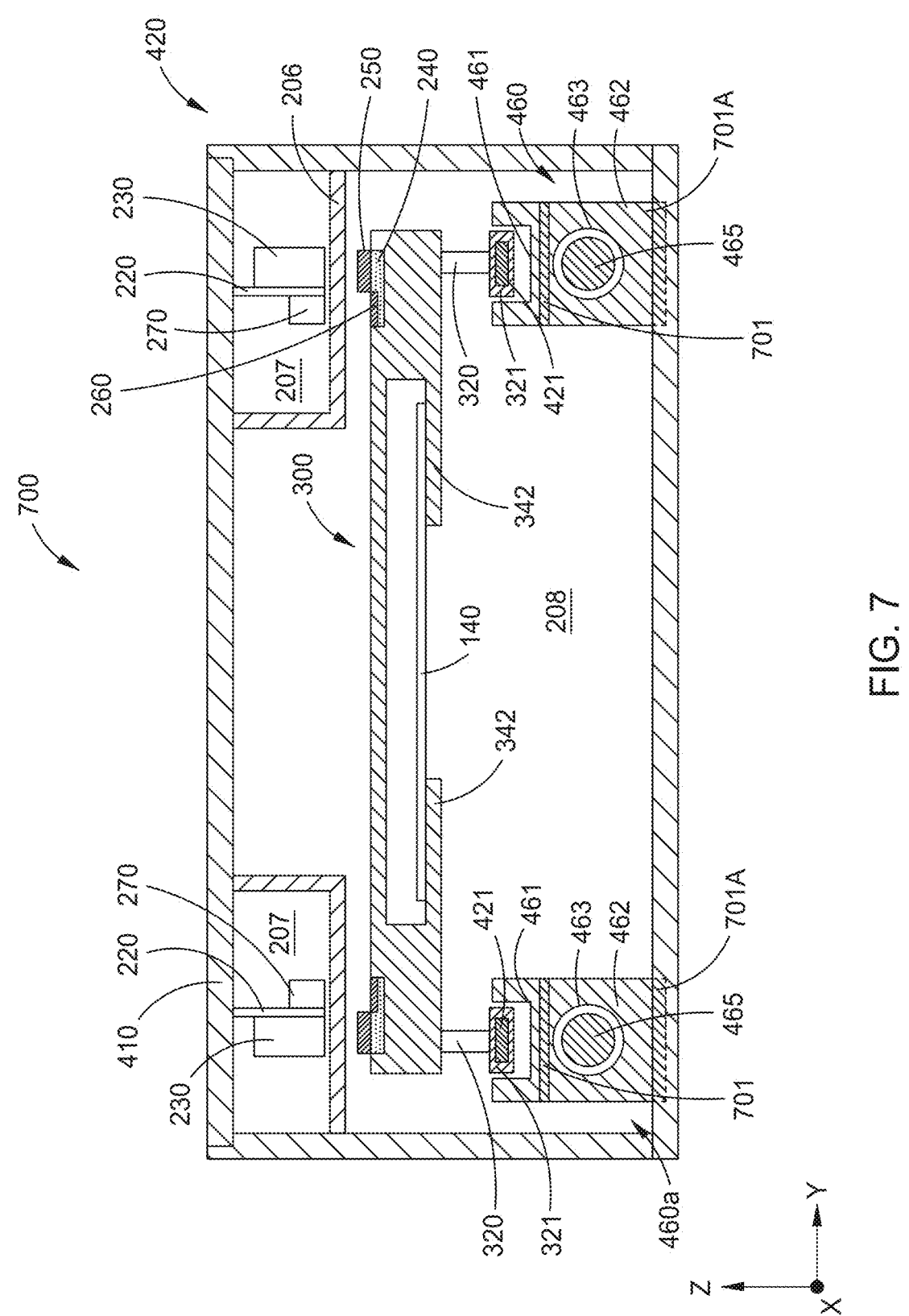
FIG. 7 illustrates a side cross-sectional view of an exemplary process station of the substrate processing system illustrated in FIG. 1, in accordance with embodiments of the present disclosure.

FIG. 7 illustrates a side cross-sectional view of an exemplary process station 700 of the substrate processing system illustrated in FIG. 1, in accordance with embodiments of the present disclosure. The processing station 700 is similar to processing station 400 of FIG. 4 with the inclusion of weight sensors 701. In some embodiments, each landing rail assembly 460 has at least one weight sensor 701 (e.g., scale). FIG. 7 shows the weight sensors 701 disposed underneath landing rails 461. The stators 230 are used to lower the carrier 300 to engage each array of legs 320 with an associated landing rail 461 to measure the weight of the carrier 300, and in some embodiments, the weight of the carrier 300 and the object 140 disposed thereon.

In some embodiments, the entire landing rail system 460a is instead disposed on at least one weight sensor 701A, shown in dashed lines.

In some embodiments, the weight of the carrier 300 may be used to identify the carrier 300. For example, the substrate processing system 100 has multiple carriers 300 each having a unique weight. The carrier 300 may then be weighed in the process station 600 on the weight sensor to identify the carrier 300 from the other carriers 300. The controller 150 is in communication with the weight sensor 701 and can compare the weight of the carrier 300 to the listed weights of the carriers 300 to determine which carrier 300 is being weighed.

In some embodiments, weighing the carrier 300 is used determine the end of the life cycle of the carrier 300. The carrier 300 may accumulate unwanted deposited material due to particulates originating from some processes occurring within the processing region 204. Overweight carriers are harder to levitate and maintain in a stable orientation. Enough material may be deposited on the carrier 300 such that the carrier 300 cannot be levitated in a controlled manner through the processing station. The carrier 300 may reach a weight that is not suitable for continued use. The carrier 300 will need to be cleaned and/or repaired to remove the material or replaced. The weight of the carrier 300 may be used to determine when the repair or replacement of the carrier 300 is needed.

Firstly, the carrier 300 may be weighed in process station 700 to determine if the carrier 300 meets or exceeds a weight threshold. For example, the carrier 300 may be weight once the carrier 300 is moved to the park position after transferring the object 140 to the substrate support. The weight threshold may be a weight of the carrier 300 that exceeds the normal weight of the carrier 300 but is less than the maximum weight that can be conveyed in a controlled manner through the station. The controller 150 compares the weight of the carrier 300 to the weight threshold and determines if the carrier 300 is overweight. If the carrier 300 exceeds the weight threshold, then the carrier 300 is then conveyed to the load lock (e.g. first station 111) or other station allowing access to the carrier 300 where the carrier 300 will be removed from the substrate processing system 100 to be replaced or serviced. If the carrier 300 does not exceed the weight threshold, then the carrier 300 is continued to be used to convey objects 140.

Secondly, the lifecycle of the carrier 300 can be estimated by weighing the carrier 300. The carrier 300 may be weighed in at least one station, such as station 700, of the processing line 102. In some embodiments, the carrier 300 is weighed in each station of the processing line 102. Thus, the controller 150 may track the weight of the carrier 300 over time. The controller 150 may also determine the average weight deposited on the carrier 300 in each station or deposited during each loop around the processing line 102 based on the weight information obtained over each processing cycle. In some embodiments, the controller 150 approximates how many more processing cycles the carrier 300 can be used. The controller 150 can modify the estimate with additional data from weights from subsequent processing. The controller 150 may recommend the replacement or repair of a carrier 300 once the controller 150 determines that the carrier 300 is becoming overweight. The controller 150 may track the weight of the carrier 300 each time the carrier 300 is weighed in the processing system 100.

In some embodiments, measuring the weight of the carrier 300 can be used to detect if the substrate has fallen off the carrier 300. For example, the carrier 300 may have a weight that is inconsistent with being loaded with a substrate.

In some embodiments, process station 700 may not have membranes 206 that are shown in FIG. 7. The magnetic levitation actuation assemblies 120A may instead be located in the transport region 208 (e.g., vacuum chamber, second region).

Figure 8:
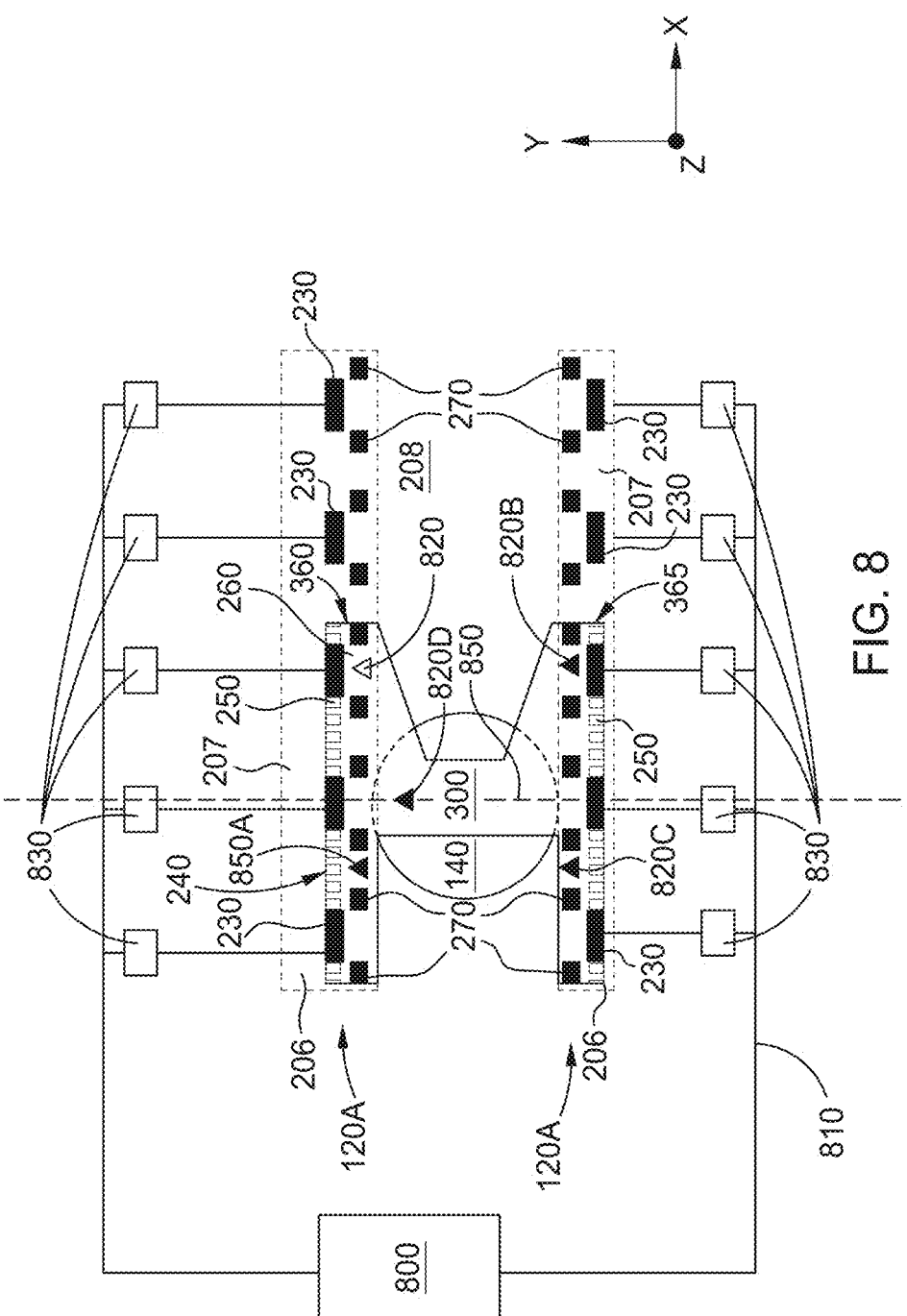
FIG. 8 illustrates a schematic top view of the example station shown in FIG. 2A showing the carrier in a first position, in which embodiments of the present disclosure may be implemented.

FIG. 8 shows the carrier 300 in a first position with an object 140 (e.g., substrate) disposed thereon. The carrier 300 is shown levitated under three pairs of stators 230 that are spaced apart in the Y-direction. In some embodiments, each individual stator in the stator pair is part of a separate magnetic levitation actuator assembly 120A disposed above a separate membrane 206. The three pair of stators 230 are activated by the controller 150 to levitate the carrier 300 and to move the carrier 300 in the transportation direction (X-direction) to the next pair of stators 230. As shown, two magnetic levitation actuator assembly 120A are each housed in separate first regions 207 disposed above opposing wings 360, 365 of the carrier 300. Each first regions is 207 separated from the second region 208 by a different membrane 206. In some embodiments, the membranes 206 shown in FIG. 8 are omitted.

A weighted feature 820 (e.g., mass element) may be positioned on the carrier 300. The weighed feature 820 is used to identify the carrier 300. In FIG. 8, the weighted feature 820 is shown on a first wing 360 near a first end 361 of the first wing 360. In some embodiments, the weighted feature 820 is embedded at a location in the first wing 360 under the features 250 or the featureless element 260 (not shown in FIG. 8). FIG. 8 also shows alternative weighted features 820A-D shown in different locations on the carrier 300. The weighted feature 820A is shown on the first wing 360 on the other side of the transverse axis 850 of the carrier 300. The weighted feature 820B is shown on a second wing 365 near a first end 361 of the second wing 365. The weighted feature 820C is shown on the second wing 365 on the other side of the transverse axis 850 from the weighted feature 820B. The weighted features 820A-C may also be embedded under the features 250 or the featureless element 260. The weighted feature 820D is shown on the portion of the base 310 above the substrate 140. The weighted feature 820D may be embedded in the base 310 or fixed on the surface of the base 310. In some embodiments, the weighted feature (e.g., weighted features 820, 820A, 820B, 820C, 820D) has a mass that is a multiple of 10 grams such as 20 grams, 30 grams, etc.

The carrier 300 may be weighed by measuring the current supplied to the stators 230 from power supply 800 to levitate the carrier 300 at a vertical position within the second region 208. The sensors 270 are used to determine that the carrier 300 is disposed in the vertical positions underneath each stator 230, such as confirming that the carrier 300 is at a level orientation while levitated at the vertical position. For example, the current supplied to each stator 230 may be increased until the two sensors 270 adjacent to each stators determines that the carrier 300 is at the desired vertical distance below the stator 230. A different current may be supplied to one or more stators 230 based on the difference in the weight of the portion of the carrier 300 underneath the stator 230. In other words, each stator 230 may generate a different levitation force to levitate the carrier 300 at the vertical position.

The power supply 800 is connected to the stators 230 by separate supply lines 810 (shown schematically as two branched lines in FIG. 8). A current meter 830 is used to measure the current supplied to each stator 230. The current meters 830 measure the current supplied to each stator 230 to position the carrier 300 in the vertical positon used to determine the weight of the carrier 300. The measured current supplied to each stator 230 can be used to determine the total force needed to levitate the carrier at the vertical position. This total force is then used to determine the weight of the carrier 300.

The identity of the carrier 300 may be ascertained based on the determined weight. For example, each carrier 300 in a group of carriers 300 may have a weighted feature 820 that has a different weight, allowing the identity of each carrier 300 to be differentiated based on the weight of the weighted feature 820.

In some embodiments, a carrier 300 is identified based on the location and weight of the weighed feature 820. As noted above, the current supplied to each stator 230 may be different based on localized weight differences in the carrier 300. The current supplied to each stator 230 may be analyzed to determine the weight and location of the weighed feature 820 on the carrier 300. For example, the controller 150 may determine which stator 230 required the most current. This current may be used to calculate the weight of the weighed feature 820. In some embodiments, the current is indexed directly to the weight of the weighted feature rather than the weight of the weighed feature being calculated from the force supplied by the stator 230. Additionally, the location of the stator 230 is fixed relative to the carrier 300. In some embodiments, the location of the stator 230 requiring the most current is indicative of the location of the weighted feature 820 on the carrier 300. In other words, the increased current to that stator 230 indicates that the weighted feature 820 is beneath that stator 230. In some cases, two stators 230 may require more current than others, indicating that the weighted feature 820 is located between the two stators 230. Therefore, the controller 150 may differentiate between the identity of a carrier 300 based on the weight and location of the weighted feature.

In some embodiments, several carriers 300 in the group may have weighed features 820 at the same location each having differing weights. For example, four carriers 300 may have a weighed feature 820 located at the first location shown in FIG. 8. However, the weighted feature 820 at the first location on the four carriers have four unique masses. Thus, the controller 150 can differentiate between multiple carriers each having a weighted feature 820 located at the same location.

In some embodiments, each carrier 300 in the group has a plurality of potential carrier locations. For example, each carrier 300 in the group may have two, three, or four possible places in which the weighted feature 820 is positioned. Each carrier 300 in the group has a unique combination of the weight of the weighted feature 820 at a location. In other words, two carriers 300 in the group may have a weighted feature 820 with the same mass, but the weighted features 820 on the two carriers are located at different positions on their respective carrier 300. The controller 150 may analyze the measured current supplied to the stators 230 to identify the carrier 300 from the group based on the weight of the weighted feature 820 at that location on the carrier 300.

In some embodiments, some or all of the carriers 300 in a group do not have a discrete weighted feature 820 disposed thereon. Instead, some or all of the carriers 300 may simply be manufactured to have a specific weight.

In some embodiments, identifying the carrier 300 based on weight, such as by the location and mass of a weighted feature 820, occurs while the object 140 is disposed on the carrier 300. In some embodiments, the carrier 300 may be identified by weight after the object 140 is transferred to the substrate support 209.

Additionally, the controller 150 may determine the identity of the carrier 300 based on the mass of the carrier 300 or the mass of the weighted feature 820, such as the mass and location of the weighted feature, rather than using the weight.

A substrate 140 may slip from substrate supports 342 while the carrier 300 is conveyed in the processing line 102. The controller 150 can also analyze the current supplied to the stators 230 to determine if the substrate 140 is disposed on the carrier 300. For example, the controller 150 can analyze the measured current to determine the weight of the carrier 300. The weight of the carrier 300 is then compared to a threshold to determine if the substrate 140 is disposed on the carrier 300. In other words, each carrier 300 in the group of carriers should exceed a baseline weight if a substrate 140 is disposed thereon. If the substrate 140 has fallen off the carrier 300 (e.g., loss of substrate 140 from carrier), then the carrier 300 will be lighter than expected indicating that the substrate 140 is not disposed on the carrier 300 being levitated by the stators 230.

The controller 150 may confirm the presence of the substrate 140 prior to transferring to moving the carrier 300 to the transfer position 208C or prior to moving the carrier 300 into a different station. The controller 150 may also identify the carrier 300 in addition to determining if the substrate 140 is disposed thereon. The identity of the carrier 300 may be ascertained using any of the techniques disclosed herein, such as by weight or by using a reference element 490.

Figure 9:
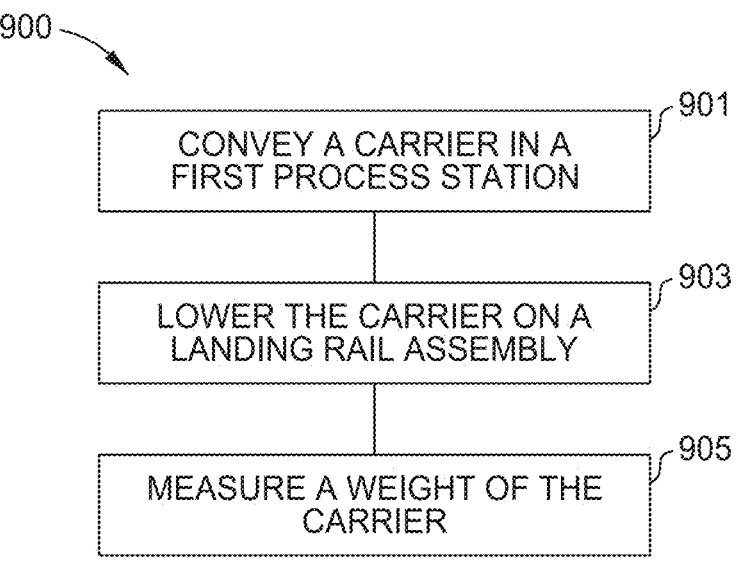
FIG. 9 is a flow diagram describing a method of measuring the weight of a carrier, in accordance with embodiments of the present disclosure.

FIG. 9 is a flow diagram describing a method 900 of measuring the weight of the carrier 300. At operation 901, the carrier 300 is conveyed into the second region 208 of the process station 600. The carrier is conveyed using magnetic levitation as described above. The carrier 300 is positioned such that one or more legs 320 of the carrier 300 are positioned above one or more landing rails 461 of the landing rail assembly as shown in the landing rail assembly 460. The carrier 300 is conveyed to a park position in the process station 700. In some embodiments, after entering the process station 700 and prior to being conveyed to the park position, the carrier 300 is conveyed to a transfer position.

At the transfer position, the object 140 is transferred to the substrate support. The carrier 300 is then conveyed the to the park position.

At operation 903, the carrier 300 is lowered onto the landing rail assembly 460. The carrier 300 is lowered into engagement with the landing rail assembly 460 using the plurality of stators 230 disposed in the first region 207 of the process station 600. When the carrier 300 has two arrays of legs 320, a first array of legs 320 is lowered on to a first landing rail 461 and a second array of legs 320 are lower onto a second landing rail 461. One or more weight sensors, such as the weight sensors 701 shown in FIG. 7, measure the weight of the carrier 300.

At operation 905, the weight of the carrier 300 is measured. The weight sensors 701 are positioned on the landing rail assembly 460 and measure a first weight of the carrier 300. The weight of the carrier 300 analyzed by the controller 150. After the carrier 300 is weighed, the carrier 300 is raised off the landing rail assembly 460 with the plurality of stators 230. In some embodiments, the carrier 300 is weighed a second time. A second weight of the carrier 300 may be measured a second time in the process station 700, such as after processing or after the carrier 300 has progressed through the entire processing line 102 and returns to the process station 700. The second weight may be measured in a different process station or multiple weights may be measured in multiple process stations.

Figure 10:
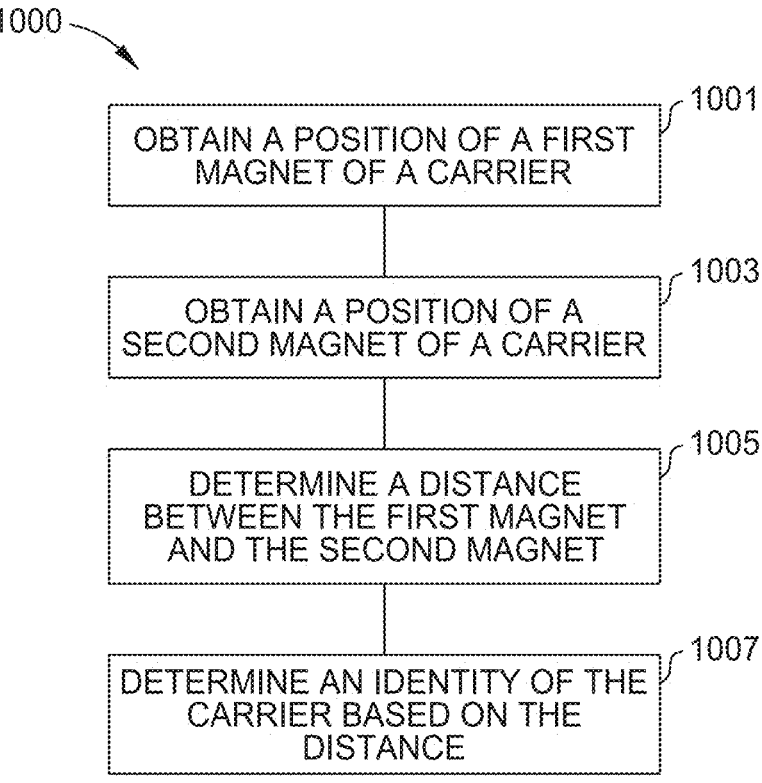
FIG. 10 is a flow diagram describing a method of identifying a substrate carrier, in accordance with embodiments of the present disclosure.

FIG. 10 is a flow diagram describing a method 1000 identifying a substrate carrier 300.

At operation 1001, a position of the first magnet of the carrier 300 is obtained by a first position sensor 465. In some embodiments, the position of the first magnet is obtained by the controller 150 measuring a time for an electric pulse to travel down the position sensor 465. The speed of the electric pulse is modified by the first magnet. In some embodiments, the first magnet is disposed in the first leg 320A, such as first magnet 521A as shown in FIG. 5. In other embodiments, the first magnet is disposed on a first side of the carrier 300, such as magnet 621 shown in FIG. 6.

At operation 1003, a position of the second magnet of the carrier 300 is obtained by a second position sensor. In some embodiments, the position of the second magnet is obtained by the controller 150 measuring a time for an electric pulse to travel down the position sensor 465. The speed of the electric pulse is modified by the second magnet. In some embodiments, the second magnet is disposed in a second leg, such as second magnet 521B disposed in the second leg 320B as shown in FIG. 5. In other embodiments the second magnet is disposed on a second side of the carrier 300.

In some embodiments, the first position sensor and second position sensor are disposed in the same processing station. In some embodiments, the first position sensor is positioned in a first processing station, such as first processing station 500A, and the second position sensor is positioned in a second processing station, such as second processing station 500B.

At operation 1005, a distance between the first magnet and the second magnet is determined. The distance is determined by the controller 150 based on the obtained position of the first magnet and the obtained position of the second magnet.

At operation 1007, an identity of the carrier 300 is determined. The identity of the carrier 300 is determined by the controller 150 comparing the distance calculated to the identification distances D1 of the plurality of carriers 300. In some embodiments, the carrier includes a third magnet detectable by a third position sensor, such as a third position sensor disposed in at least one of the first processing station or the second processing station. The position of the carrier 300 in the process system 100 is determined based on the position of the third magnet.

In one embodiment, a method of measuring a weight of the carrier is includes conveying the carrier into the transport region of a first process station a first time. The method further includes lowering the carrier into engagement with the landing rail assembly using the plurality of stators disposed in the first region of the first process station. The membrane isolates the first region from the transport region. The method further includes measuring a first weight of the carrier engaged with the landing rail assembly.

In some embodiments, the method of weighing the carrier further includes the controller determining the weight of the carrier. The controller determines if the substrate is disposed on the carrier. After measuring the first weight, the carrier is raised off the landing rail assembly using the plurality of stators. The method may further include conveying the carrier into the transport region of the first process station a second time. During the second time, the carrier is lowered into engagement with the landing rail assembly using the plurality of stators. Then, a second weight is measured of the carrier engaged with the landing rail assembly.

In some embodiments of the method of weighing the carrier, the carrier the carrier is conveyed to a transfer position prior to lowering the carrier. The substrate is transferred from the carrier to the substrate support. The carrier is then conveyed to a park position. In some embodiments, the second weight is compared to the first weight to determine an approximate number of additional processing cycles the carrier can be conveyed into the first process station before the carrier exceeds a weight threshold. The carrier is replaced or serviced after the weight threshold is met. In some embodiments, the first weight may be compared to the weight threshold. The carrier is replaced if the first weight meets or exceeds the weight threshold. In some embodiments, the carrier is a member of a plurality of carriers includes the carrier, the plurality of carriers each have a unique weight. In some embodiments, the carrier is identified from the plurality of carriers based on the first weight.

In one embodiment, a non-transitory computer-readable medium storing instructions that, when executed by a processor, cause a computer system to perform actions. The actions include conveying the carrier to the first position. The carrier is one of a plurality of carriers disposed in a processing line of a processing system. A position of the first magnet of the carrier is obtained with the first position sensor. A position of a second magnet of the carrier is obtained with the second position sensor. Next, a distance is determined between the first magnet and the second magnet of the carrier based on the obtained position of the first magnet and the obtained position of the second magnet. An identity of the carrier of the plurality of carriers is determined based on the distance between the first magnet and second magnet of the carrier. In some embodiments, the first position sensor is disposed in a first processing station and the second position sensor is disposed in a second processing station. The non-transitory computer-readable medium may also include obtaining a position of the third magnet of the carrier with a third position sensor disposed in the first processing station, and determining a position of the carrier within the first processing station based on the obtained position of the third magnet.

In summation, the carriers that the substrates are disposed on are circulated through a plurality of stations. In some embodiments, the position of magnets on the carriers can be a unique signature identifying the carrier. The carriers can also be identified by having a unique weight. The carrier can also be identified by an identification sensor disposed in the station that detects an identification element of the carrier (e.g., a physical feature or barcode, RF tags). Benefits of tracking the position of the carrier within the station and the identity of the carrier within the station includes proper fabrication on the substrates at each specific process station. Additionally, the weight of the carrier can also be determined to evaluate if the carrier needs to be replaced due to deposition build up.

In one embodiment, a method of measuring a weight of a carrier comprises: supplying a current to a plurality of stators of a substrate station to levitate a carrier of a plurality of carriers in a vertical position within a transport region within the substrate station, wherein each carrier of the plurality of carriers has a unique weight; measuring the current supplied to at least one stator of the plurality of stators to levitate the carrier at the vertical position; determining a force generated by the at least one stator to levitate the carrier at the vertical position based on the measured current; and determining a weight of the carrier levitated at the vertical position based on the force.

In one or more embodiments of the method of measuring a weight of the carrier, the method further comprises determining that the carrier is levitated in the vertical position using a sensor.

In one or more embodiments of the method of measuring a weight of the carrier, the method further comprises identifying which carrier of the plurality of carriers is disposed within the substrate station based on the determined weight.

In one or more embodiments of the method of measuring a weight of the carrier, measuring the current supplied to the at least one stator includes measuring the current supplied to each stator; and determining the force generated by the at least one stator includes determining the force generated by each stator.

In one or more embodiments of the method of measuring a weight of the carrier, each carrier has a unique weight differentiating each carrier from a plurality of carriers.

In one or more embodiments of the method of measuring a weight of the carrier, the carrier includes a weighted feature to give the carrier the unique weight.

In one or more embodiments of the method of measuring a weight of the carrier, a location of the weighted feature on the carrier is used to identify the carrier.

In one or more embodiments of the method of measuring a weight of the carrier, the method further comprises detecting a loss of a substrate from a substrate support of the carrier based on a detected weight.

In one or more embodiments of the method of measuring a weight of the carrier, the method further comprises determining that a substrate is disposed on the carrier by comparing the determined weight to a threshold weight.

In one embodiment, a method of identifying a carrier comprises: supplying a current to a plurality of stators of a substrate station to levitate a carrier of a plurality of carriers in a vertical position within a transport region within the substrate station, wherein each carrier of the plurality of carriers has a weighted feature placed at a location of the carrier; measuring the current to each stator of the plurality of stators above the carrier; determining a force generated by each stator based on the measured current supplied to each stator; determining the location and a weight of the weighted feature based on differences in current to each stator; and identifying which carrier of the plurality of carriers is within the substrate station based on the weight and location of the weighed feature.

In one or more embodiments of the method of identifying the carrier, the location of the weighted feature comprises on a base of the carrier, or below a stator of the plurality of stators.

In one or more embodiments of the method of identifying the carrier, the method further comprises determining that the carrier is levitated in the vertical position using a plurality of sensors.

In one or more embodiments of the method of identifying the carrier, the method further comprises determining a total weight of the carrier based on the force generated by each stator.

In one or more embodiments of the method of identifying the carrier, the weighted feature has a mass that is a multiple of 10 grams.

In one or more embodiments of the method of identifying the carrier, the method further comprises determining that a substrate is not disposed on the carrier by comparing a total weight to a weight threshold.

In one embodiment, a substrate processing station comprises a housing; a membrane disposed in the housing, the membrane isolating a first region within the housing from a second region within the housing; a magnetic levitation actuator assembly disposed in the first region, wherein the magnetic levitation actuator assembly is configured to generate a first magnetic field that extends through the membrane and within a transport region to convey a carrier within the transport region; and a landing rail system at least partially disposed in the transport region, the landing rail system including at least one weight sensor configured to measure a weight of the carrier when the carrier is engaged with the landing rail system.

In one or more embodiments of the substrate processing station, the substrate processing station further comprises a controller in communication with the weight sensor.

In one or more embodiments of the substrate processing station, the controller is configured to track the weight of the carrier.

In one or more embodiments of the substrate processing station, the carrier is one of a plurality of carriers each having a unique weight, and wherein the controller is configured to identify which carrier is disposed in the second region.

In one or more embodiments of the substrate processing station, the landing rail system includes at least two landing rail assemblies, each landing rail assembly including one or more weight sensors of the at least one weight sensor.

In one embodiment, a carrier comprises: a base including a top side, a first side, a second side, and a bottom side; a first array of features coupled to the top side of the base; at least one support member coupled to the base, the at least one support member configured to support a substrate; and a first magnet and a second magnet coupled to the base, wherein the first magnet and the second magnet are spaced apart by an identification distance, wherein the identification distance is indexed to an identity of the carrier.

In one or more embodiments of the carrier, the carrier further comprises a first array of legs coupled to the bottom side of the base, wherein the first magnet is embedded in a first leg of the first array of legs and the second magnet is embedded in a second leg of the first array of legs.

In one or more embodiments of the carrier, the first magnet and the second magnet are embedded either the first side or the second side of the base.

In one or more embodiments of the carrier, the carrier further comprises a third magnet coupled to the base.

In one or more embodiments of the carrier, the carrier further comprises a first array of legs coupled to the bottom side of the base, wherein the first magnet is embedded in a first leg of the first array of legs and the second magnet is embedded in a second leg of the first array of legs; and a second array of legs coupled to the bottom side of the base, wherein a third magnet is embedded in a first leg of the second array of legs.

In one or more embodiments of the carrier, the carrier further comprises a second set of features coupled to the base.

In one or more embodiments of the carrier, the first magnet and the second magnet are disposed on the first side of the carrier.

In one embodiment, a method of identifying a substrate carrier within a processing line of a substrate processing system comprises obtaining a position of a first magnet of a carrier with a first position sensor of a first station of the processing line, wherein the carrier is one of a plurality of carriers disposed in the processing line; obtaining a position of a second magnet of the carrier with the first position sensor; determining a distance between the first magnet and the second magnet of the carrier based on the obtained position of the first magnet and the obtained position of the second magnet; and determining an identity of the carrier within the first station based on the distance between the first magnet and second magnet.

In one or more embodiments, the method of identifying the substrate within the processing line further comprises monitoring a position of the carrier within the first station by obtaining the position of either the first magnet or the second magnet as the carrier is conveyed within the first station.

In one or more embodiments, the method of identifying the substrate within the processing line further comprises monitoring a position of the carrier within the first station by obtaining the position of the first magnet and the second magnet as the carrier is conveyed within the first station.

In one or more embodiments, the method of identifying the substrate within the processing line further comprises weighing the carrier; and indexing a weight of the carrier with the identity of the carrier.

In one or more embodiments of the method of identifying the substrate within the processing line, the carrier includes an array of feet engageable with a landing rail assembly disposed in the first station, wherein the array of feet includes a first foot and a second foot; the first magnet is disposed in the first foot; the second magnet is disposed in the second foot; and the first position sensor is disposed in the landing rail assembly.

In one or more embodiments of the method of identifying the substrate within the processing line, the first magnet and the second magnet are disposed in a side surface of the carrier; and the first position sensor is disposed in a first region of the first station isolated from a second region of the first station, wherein the carrier is disposed in the second region.

In one or more embodiments of the method of identifying the substrate within the processing line, the carrier further comprising at least one array of feet.

In one embodiment, a method of identifying a substrate carrier comprises: obtaining a position of a first magnet of a carrier with a first position sensor, wherein the carrier is one of a plurality of carriers disposed in a processing line of a processing system; obtaining a position of a second magnet of the carrier with a second position sensor; determining a distance between the first magnet and the second magnet of the carrier based on the obtained position of the first magnet and the obtained position of the second magnet; and determining an identity of the carrier based on the distance between the first magnet and second magnet.

In one or more embodiments of the method of identify the substrate carrier, the first position sensor is disposed in a first processing station and the second position sensor is disposed in a second processing station.

In one or more embodiments of the method of identify the substrate carrier, the method further comprises obtaining a position of a third magnet of the carrier with a third position sensor disposed in the first processing station; and determining a position of the carrier within the first processing station based on the obtained position of the third magnet.

In one or more embodiments of the method of identify the substrate carrier, the first position sensor and the second position sensor are disposed in a processing station.

In one or more embodiments of the method of identify the substrate carrier, the method further comprises determining a position of the carrier within the processing station based on the obtained position of the first magnet or the second magnet.

In one or more embodiments of the method of identify the substrate carrier, the first magnet is disposed in a first foot of the carrier; and the second magnet is disposed in a second foot of the carrier, the first foot and the second foot are each feet in an array of feet of the carrier.

In one embodiment, a substrate processing station comprises: a housing; a membrane disposed in the housing, the membrane isolating a first region within the housing from a second region within the housing; a magnetic levitation actuator assembly disposed in the first region, wherein the magnetic levitation actuator assembly is configured to generate a first magnetic field that extends through the membrane into the second region to levitate a carrier within second region; and an identification sensor disposed in the housing, the identification sensor configured to detect an identification element of the carrier, and wherein the carrier includes a top side, a bottom side, a first side, and a second side.

In one or more embodiments of the substrate processing station, the identification sensor comprises at least one of a barcode reader, a radio-frequency identification (RFID) reader, or an optical sensor, and the identification element comprises at least one of a barcode detectable by the barcode reader, a RFID tag detectable by the RFID reader, or a physical marking detectable by the optical sensor.

In one or more embodiments of the substrate processing station, the identification element is disposed on the top side of the carrier and the identification sensor is disposed on the housing opposing the identification element.

In one or more embodiments of the substrate processing station, the identification element is disposed on the first side of the carrier and the identification sensor is disposed on the housing opposing the identification element.

In one or more embodiments of the substrate processing station, the identification element is disposed on the bottom side of the carrier and the identification sensor is disposed on the housing opposing the identification element.

In one or more embodiments of the substrate processing station, the identification element is disposed on the top side of the carrier and the identification sensor is disposed in the first region opposing the identification element.

In one or more embodiments of the substrate processing station, the processing station further comprises a landing rail assembly at least partially disposed in the second region, the landing rail assembly including at least one weight sensor configured to measure a weight of the carrier when the carrier is engaged with the landing rail assembly.

In one or more embodiments of the substrate processing station, the processing station further comprises a position sensor configured to determine a position of the carrier within the second region.

In one embodiment, a carrier comprises: a base including a top side, a bottom side, a first wing, and a second wing; a first array of features disposed on an upper surface of the first wing; a second array of features disposed on an upper surface of the second wing; at least one support member coupled to the base, the at least one support member configured to support a substrate; and at least one weighted feature coupled to the base to identify the carrier from a group of carriers.

In one or more embodiments of the carrier, the weighted feature is positioned on the base above the support member.

In one or more embodiments of the carrier, the carrier further comprises a first featureless element is disposed on the first wing parallel to the first array of features; and a second featureless element is disposed on the second wing parallel to the second array of features.

In one or more embodiments of the carrier, the weighted feature is embedded in the first wing below the first array of features or the first featureless element.

In one or more embodiments of the carrier, the weighted feature is embedded in the second wing below the second array of features or the second featureless element.

In one or more embodiments of the carrier, the at least one weighted feature is one weighted feature having a first weight, wherein the first wing includes the one weighted feature, and wherein the one weighed feature is disposed at a first position underneath the first array of features.

In one or more embodiments of the carrier, each weighed feature of the at least one weighted feature has a mass that is a multiple of 10 grams.

In one embodiment, a substrate processing system comprises a factory interface; and a processing line, the processing line including a plurality of stations with a plurality of discrete carrier positions, wherein a number of carriers are magnetically levitated and conveyed through the processing line, wherein the number of carriers is equivalent to the number of discrete carrier positions in the processing line minus at least one.

In one or more embodiments of the substrate processing system, the number of carriers is equivalent to the number of discrete carrier positions in the processing line minus two.

In one or more embodiments of the substrate processing system, the processing line includes at least eight stations, the at least eight stations including a load lock having one discrete carrier position, three routing stations each having one discrete carrier position, and at least four process stations each having at least two discrete carrier positions.

In one or more embodiments of the substrate processing system, the at least four processing stations each have two discrete carrier positions.

In one or more embodiments of the substrate processing system, wherein at least one of the at least four processing stations includes three discrete carrier positions.

While the foregoing is directed to embodiments of the present disclosure, other and further embodiments of the disclosure may be devised without departing from the basic scope thereof, and the scope thereof is determined by the claims that follow.

What is claimed is:

1. A method of measuring a weight of a carrier, comprising:

supplying a current to a plurality of stators of a substrate station to levitate a carrier of a plurality of carriers in a vertical position within a transport region within the substrate station, wherein each carrier of the plurality of carriers has a unique weight;

measuring the current supplied to at least one stator of the plurality of stators to levitate the carrier at the vertical position;

determining a force generated by the at least one stator to levitate the carrier at the vertical position based on the measured current; and determining a weight of the carrier levitated at the vertical position based on the force.

2. The method of claim 1, further comprising determining that the carrier is levitated in the vertical position using a sensor.

3. The method of claim 1, further comprising identifying which carrier of the plurality of carriers is disposed within the substrate station based on the determined weight.

4. The method of claim 2, wherein:

measuring the current supplied to the at least one stator includes measuring the current supplied to each stator; and determining the force generated by the at least one stator includes determining the force generated by each stator.

5. The method of claim 3, wherein each carrier has a unique weight differentiating each carrier from a plurality of carriers.

6. The method of claim 5, wherein the carrier includes a weighted feature to give the carrier the unique weight.

7. The method of claim 6, wherein a location of the weighted feature on the carrier is used to identify the carrier.

8. The method of claim 3, further comprising detecting a loss of a substrate from a substrate support of the carrier based on a detected weight.

9. The method of claim 1, further comprising:

determining that a substrate is disposed on the carrier by comparing the determined weight to a threshold weight.

10. A method of identifying a carrier, comprising:

supplying a current to a plurality of stators of a substrate station to levitate a carrier of a plurality of carriers in a vertical position within a transport region within the substrate station, wherein each carrier of the plurality of carriers has a weighted feature placed at a location of the carrier;

measuring the current to each stator of the plurality of stators above the carrier;

determining a force generated by each stator based on the measured current supplied to each stator;

determining the location and a weight of the weighted feature based on differences in current to each stator; and identifying which carrier of the plurality of carriers is within the substrate station based on the weight and location of the weighed feature.

11. The method of claim 10, wherein the location of the weighted feature comprises on a base of the carrier, or below a stator of the plurality of stators.

12. The method of claim 10, further comprising determining that the carrier is levitated in the vertical position using a plurality of sensors.

13. The method of claim 10, further comprising determining a total weight of the carrier based on the force generated by each stator.

14. The method of claim 10, wherein the weighted feature has a mass that is a multiple of 10 grams.

15. The method of claim 14, further comprising:

determining that a substrate is not disposed on the carrier by comparing a total weight to a weight threshold.

16. A substrate processing station, comprising:

a housing;

a membrane disposed in the housing, the membrane isolating a first region within the housing from a second region within the housing;

a magnetic levitation actuator assembly disposed in the first region, wherein the magnetic levitation actuator assembly is configured to generate a first magnetic field that extends through the membrane and within a transport region to convey a carrier within the transport region; and a landing rail system at least partially disposed in the transport region, the landing rail system including at least one weight sensor configured to measure a weight of the carrier when the carrier is engaged with the landing rail system.

17. The substrate processing station of claim 16, further comprising a controller in communication with the weight sensor.

18. The substrate processing station of claim 17, wherein the controller is configured to track the weight of the carrier.

19. The substrate processing station of claim 17, wherein the carrier is one of a plurality of carriers each having a unique weight, and wherein the controller is configured to identify which carrier is disposed in the second region.

20. The substrate processing station of claim 16, wherein the landing rail system includes at least two landing rail assemblies, each landing rail assembly including one or more weight sensors of the at least one weight sensor.

* * * * *